US011428747B2

(12) United States Patent
Ukumori

(10) Patent No.: US 11,428,747 B2
(45) Date of Patent: Aug. 30, 2022

(54) DEGRADATION ESTIMATING DEVICE, DEGRADATION ESTIMATING METHOD, AND COMPUTER PROGRAM

(71) Applicant: GS Yuasa International Ltd., Kyoto (JP)

(72) Inventor: Nan Ukumori, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 287 days.

(21) Appl. No.: 16/498,868

(22) PCT Filed: Mar. 28, 2018

(86) PCT No.: PCT/JP2018/013035
§ 371 (c)(1),
(2) Date: Sep. 27, 2019

(87) PCT Pub. No.: WO2018/181609
PCT Pub. Date: Oct. 4, 2018

(65) Prior Publication Data
US 2020/0057113 A1    Feb. 20, 2020

(30) Foreign Application Priority Data

Mar. 29, 2017  (JP) .............................. JP2017-065532
Mar. 29, 2017  (JP) .............................. JP2017-065536
(Continued)

(51) Int. Cl.
*G01R 31/392*    (2019.01)
*H01M 10/48*    (2006.01)
*G01R 31/3842*   (2019.01)

(52) U.S. Cl.
CPC ....... *G01R 31/392* (2019.01); *G01R 31/3842* (2019.01); *H01M 10/48* (2013.01)

(58) Field of Classification Search
CPC .............. G01R 31/392; G01R 31/3842; G01R 31/387; H01M 10/48; H01M 10/42; Y02E 60/10; H02J 7/00
See application file for complete search history.

(56) References Cited

U.S. PATENT DOCUMENTS

2010/0036626 A1\* 2/2010 Kang ................... G01R 31/392
702/63
2016/0268651 A1  9/2016 Arai
(Continued)

FOREIGN PATENT DOCUMENTS

JP    2011-220900 A    11/2011
JP    2016-075572 A    5/2016
(Continued)

OTHER PUBLICATIONS

International Search Report (ISR) (PCT Form PCT/ISA/210), in PCT/JP2018/013035, dated Jun. 26, 2018.
(Continued)

*Primary Examiner* — Daniel R Miller
(74) *Attorney, Agent, or Firm* — McGinn IP Law Group, PLLC

(57) ABSTRACT

A degradation estimating device includes: an acquiring unit that acquires time-series data of an SOC in an energy storage device; and an estimating unit that estimates degradation of the energy storage device based on a fluctuation magnitude of the SOC in the time-series data acquired by the acquiring unit. The degradation estimating method of an energy storage device acquires time-series data of an SOC in the energy storage device, and estimates the degradation of the energy storage device based on a fluctuation magnitude of the SOC in the acquired time-series data.

16 Claims, 17 Drawing Sheets

(30) Foreign Application Priority Data

Mar. 27, 2018 (JP) .............................. JP2018-060828
Mar. 27, 2018 (JP) .............................. JP2018-060829

(56) References Cited

U.S. PATENT DOCUMENTS

| | | |
|---|---|---|
| 2016/0377686 A1 | 12/2016 | Uchida et al. |
| 2017/0328957 A1 | 11/2017 | Suzuki et al. |
| 2018/0120385 A1* | 5/2018 | Choi .................. G01R 31/3648 |
| 2018/0172777 A1* | 6/2018 | Park ..................... G01R 31/392 |

FOREIGN PATENT DOCUMENTS

| | | |
|---|---|---|
| JP | WO2015/059746 A1 | 3/2017 |
| WO | WO 2014/155726 A1 | 10/2014 |
| WO | WO 2016/092811 A1 | 6/2016 |

OTHER PUBLICATIONS

Extended European Search Report dated Feb. 12, 2020 for European Patent Application No. 18776545.8-1010.

\* cited by examiner

US 11,428,747 B2

DEGRADATION ESTIMATING DEVICE, DEGRADATION ESTIMATING METHOD, AND COMPUTER PROGRAM

TECHNICAL FIELD

The present invention relates to a degradation estimating device, a degradation estimating method and a computer program for estimating degradation of an energy storage device.

BACKGROUND ART

An energy storage device capable of storing electrical energy and supplying the energy as a power source when needed is used. The energy storage device is applied to a portable instrument, a power supply device, transportation equipment including automobiles and railways, industrial equipment including aviation, space, and construction ones, and the like. It is important to always grasp an energy storage capacity of the energy storage device so that the stored energy can be used as required when needed. It is known that the energy storage device degrades mainly chemically in response to a time and a frequency of use. Therefore, utilizable energy decreases in response to the time and the frequency of use. It is important to grasp a degraded state of the energy storage device in order to utilize the energy as required when needed. Heretofore, techniques for estimating the degradation of the energy storage device have been developed.

In JP-A-2011-220900, a battery degradation estimating method is disclosed. The battery degradation estimating method for estimating a level of capacity degradation of a secondary battery includes a first procedure of accumulating an amount of a current flowing through the secondary battery or an elapsed time for a predetermined period so as to correspond to each of a plurality of operating conditions which affect the capacity degradation of the secondary battery. The battery degradation estimating method includes a second procedure of calculating a degradation coefficient, which indicates a ratio of a degradation rate of the secondary battery under the plurality of operating conditions with respect to a degradation rate of the secondary battery under a single operating condition, for each of the plurality of corresponding operating conditions. The battery degradation estimating method includes a third procedure of correcting such an accumulated current value or the elapsed time, which is accumulated for each of the plurality of operating conditions by the first procedure, by the degradation coefficient calculated for each of the plurality of corresponding operating conditions by the second procedure, and converting the corrected accumulated current value or elapsed time into an accumulated current value or an elapsed time under the single operating condition. The battery degradation estimating method includes a fourth procedure of estimating the level of the capacity degradation of the secondary battery based on the accumulated current value or the elapsed time, which is converted by the third procedure, and based on the degradation rate under the single operating condition.

PRIOR ART DOCUMENTS

Patent Documents

Patent Document 1: JP-A-2011-220900

SUMMARY OF THE INVENTION

Problems to be Solved by the Invention

In the conventional method, estimation accuracy for the degradation of the energy storage device has sometimes been insufficient.

In the conventional method, a variety of operating conditions (a charge-discharge pattern, a charge-discharge rate, an ambient temperature and the like) of the energy storage device are predicted, and tests and calculations are performed under the respective predicted operating conditions, whereby data regarding the degradation of the energy storage device are stored in a data table in advance. After the energy storage device is started to be used, an actual operating condition is measured in real time, data associated with a predicted operating condition approximate to the actual operating condition is read out from the data table, and the degradation of the energy storage device is estimated. In order to improve the estimation accuracy for the degradation in the conventional method, it is necessary to store data regarding as many predicted operating conditions as possible. It is cumbersome to prepare such enormous data.

Even if data are prepared for many predicted operating conditions, the actual operating condition sometimes causes a divergence from the predicted operating condition. When such a divergence occurs, the estimation accuracy for the degradation decreases. Moreover, degradation estimation/prediction by appropriate selection from the data regarding many predicted operating conditions in response to the actual operating condition is not achieved sufficiently. In such a situation, a technique for accurately estimating the degradation of the energy storage device is required.

This invention has been made in order to solve the above-mentioned problems. An object of this invention is to provide a degradation estimating device, a degradation estimating method and a computer program, which are capable of accurately estimating the degradation of the energy storage device.

Means for Solving the Problems

A degradation estimating device according to an aspect of this invention includes: an acquiring unit that acquires time-series data of a state of charge (SOC) in an energy storage device; and an estimating unit that estimates degradation of the energy storage device based on a fluctuation magnitude (difference) of the SOC in the time-series data acquired by the acquiring unit.

The "fluctuation magnitude of the SOC in the time-series data" is a difference between an SOC at a certain time t and an SOC at a time elapsed by a time Δt from the time t.

The inventor of the present invention has devised a new capacity degradation model in consideration of "dynamic" degradation due to loading and unloading of electrical energy to and from the energy storage device, i.e., due to energization (that is, in consideration of degradation due to energization). The inventor of the present invention has found an algorithm regarding degradation estimation, which is derived from the model. Specifically, the inventor of the present invention has found that a degree of the degradation of the energy storage device due to energization differs in response to the fluctuation magnitude (difference) of the SOC in the time-series data. That is, the inventor of the present invention has found that the degradation of the energy storage device depends on the fluctuation magnitude (difference) of the SOC in the time-series data. In the conventional estimating method that does not consider the fluctuation magnitude of the SOC in the time-series data, for example, an estimated degradation value when the SOC fluctuates within a range of ±10% of 50% of the SOC, which is taken as a center, and an estimated degradation value when the SOC fluctuates within a range of ±30% of 50% of the SOC, which is taken as a center, become the same (see FIGS. 21A and 21B). The conventional method cannot adapt to operating patterns (charge-discharge patterns) of the energy storage device, which vary depending on users, and cannot sufficiently improve the estimation accuracy for the degradation. It can be expected that the estimation accuracy for the degradation is improved by estimating the degradation of the energy storage device by the estimating unit based on the fluctuation magnitude of the SOC in the time-series data.

In examples of the model and the algorithm, it is conceived that those in charge of loading and unloading the electrical energy (that is, lithium ions when the energy storage device is a lithium ion battery) enter and exit a surface film (an SEI surface film when the energy storage device is a lithium ion battery) of an electrode surface, and a total amount of lithium ions present in the surface film is considered.

Moreover, lithium ions contained in a surface film peeled off from the electrode surface following charge-discharge may be considered.

Validity of the algorithm that considers such a presence distribution and/or behavior of the ions is supported from experimental data. Consideration of this will be described later.

The degradation can be accurately estimated based on the time-series data of the SOC without preparing parameters for use in estimating the degradation for each of fluctuation patterns of the SOC. Accordingly, preparation for estimating the degradation of the energy storage device can be significantly simplified. Moreover, the degradation of the energy storage device can be accurately estimated regardless of the operating patterns (SOC fluctuation patterns) of the energy storage device, which vary depending on users.

The estimating unit may estimate the degradation of the energy storage device based on the fluctuation magnitude of the SOC and a fluctuation center of the SOC in the time-series data.

The inventor of the present invention has found that not only the fluctuation magnitude of the SOC but also the fluctuation center of the SOC (center SOC) is related to the degradation of the energy storage device due to the energization. Even if SOC fluctuation ranges when the SOC is changed to a charge side (positive side) and a discharge side (negative side) are the same while taking a certain SOC as a reference, amounts of the degradation of the energy storage device due to the energization differ from each other when the center SOC differs therebetween (see FIG. 21C). A phenomenon of the degradation is a chemical change, and the chemical change depends on a surrounding environment of main chemical species. It is conceived that, since the environment changes when the center SOC differs, the amount of degradation due to the energization of the energy storage device also differs. It is conceived that a main factor of the capacity degradation of the energy storage device is a shift of a capacity balance between a positive electrode and a negative electrode (that is, a difference between capacities in which charge ions can reversibly enter and exit electrodes in a positive electrode and negative electrode of the energy storage device). The shift of the capacity balance is attributed to the fact that there grows a surface film (an SEI surface film when the energy storage device is a lithium ion battery) on a negative active material. It is inferred that the fact that the center SOC differs, that is, a potential of the negative active material differs affects the growth of the SEI surface film. With such a configuration of estimating the degradation of the energy storage device based on the fluctuation magnitude of the SOC and the fluctuation center of the SOC, the degradation of the energy storage device can be accurately estimated regardless of the difference in the fluctuation center of the SOC.

The estimating unit may calculate an energization degradation value, which indicates degradation of the energy storage device due to energization, based on the fluctuation magnitude of the SOC, and may estimate the degradation of the energy storage device based on a sum of the calculated energization degradation value and a non-energization degradation value, which indicates degradation of the energy storage device, the degradation not being due to the energization.

The inventor of the present invention has paid attention to the fact that, when an energy storage device, which degrades with time if being left, is energized, degradation of the energy storage device further progresses. With such a configuration of calculating an energization degradation value, which indicates the degradation that has further progressed by the energization, based on the fluctuation magnitude of the SOC, and estimating the degradation of the energy storage device based on the sum of a calculation result and the non-energization degradation value, the degradation of the energy storage device can be estimated more accurately. The inventor of the present invention has devised a new capacity degradation model in consideration of not only "static" degradation (degradation that is not due to the energization but due to being left) of the energy storage device, which follows a simple change with time but also "dynamic" degradation due to loading and unloading of the electric energy, i.e., due to the energization (degradation due to the energization). The inventor of the present invention has found an algorithm regarding the degradation estimation, which is derived from the model.

The estimating unit may estimate the degradation of the energy storage device based on a state change of a solid electrolyte interface (SEI) surface film on the negative electrode of the energy storage device, the state change being based on the fluctuation magnitude of the SOC.

For the estimation of the amount of degradation of the energy storage device, the inventor of the present invention has adopted the state change of the SEI surface film on the negative electrode, the state change corresponding to the fluctuation magnitude of the SOC. The estimation considering a physical phenomenon in the negative electrode is performed, thus making it possible to further improve the estimation accuracy for the degradation of the energy storage device.

The estimating unit may estimate the degradation of the energy storage device based on a mathematical model in which breakage and regeneration of the SEI surface film on the negative electrode of the energy storage device are considered.

In order to estimate the degradation of the energy storage device due to the energization, the inventor of the present invention has devised the mathematical model in which the breakage and regeneration of the SEI surface film on the negative electrode of the energy storage device are considered. It is conceived that this mathematical model represents the physical phenomenon in the electrode more correctly in comparison with the conventional mathematical models.

The mathematical model also considers degradation of the energy storage device due to an SEI surface film peeled off from the negative electrode of the energy storage device.

For the mathematical model, the inventor of the present invention has adopted the degradation due to the SEI surface film peeled off from the negative electrode. It is conceived that this mathematical model represents the physical phenomenon in the electrode more correctly in comparison with the conventional mathematical models.

As mentioned above, the main factor of the capacity degradation of the energy storage device is the shift of the capacity balance. Heretofore, it has been known that the capacity of the energy storage device degrades with the elapse of time.

The inventor of the present invention has found that the shift of the capacity balance increases due to the energization. Based on this new finding, the shift of the capacity balance between the positive electrode and the negative electrode is estimated as described below, whereby the degradation estimation for the energy storage device is performed.

A degradation estimating device according to another aspect of this invention includes an estimating unit that estimates degradation of a capacity of an energy storage device based on a number of charge-discharge cycles, the capacity being an amount of electricity reversibly extractable from the energy storage device.

In this description, "estimating based on the number of charge-discharge cycles" includes a case of estimating the capacity degradation of the energy storage device based on the number of charge-discharge cycles itself, a numeric value having a correlation with the number of charge-discharge cycles (for example, an energization time), or an alternative expression of the number of charge-discharge cycles (for example, a percentage, a square root).

The estimation of the capacity degradation of the energy storage device based on the above-described number of charge-discharge cycles may be performed by using a mathematical model. Alternatively, with regard to the estimation of the capacity degradation of the energy storage device based on the above-described number of charge-discharge cycles, tests are performed and calculations are performed under a variety of predicted operating conditions of the energy storage device, whereby data regarding the capacity degradation of the energy storage device are stored in a data table in advance, and data are appropriately selected in response to actual operating conditions, whereby the estimation of the capacity degradation of the energy storage device based on the above-described number of charge-discharge cycles may be performed.

There is adopted a new finding that, for example, one of the positive electrode and the negative electrode becomes no longer fully charged due to the energization (following an increase of the number of charge-discharge cycles), and the amount of electricity reversibly extractable from the energy storage device decreases, that is, "shift of capacity balance" between the positive electrode and the negative electrode increases. In this way, the degradation of the energy storage device can be estimated more accurately than heretofore.

The estimating unit may estimate degradation of a capacity of the energy storage device in a predetermined number of charge-discharge cycles by a sum of an energization degradation value indicating degradation of the energy storage device due to energization at that point of time and a non-energization degradation value indicating degradation of the energy storage device, the degradation not being due to the energization.

As mentioned above, the inventor of the present invention has found that the shift of the capacity balance increases due to the energization. Heretofore, it has been conceived that, with the elapse of time, the shift of the capacity balance occurs by a same amount between a case where the energy storage device is energized and a case where the energy storage device is not energized. When the degradation of the capacity of the energy storage device in a predetermined number of charge-discharge cycles is estimated based on the new finding by the sum of the energization degradation value and the non-energization degradation value at that point of time, the degradation of the energy storage device can be estimated more accurately than heretofore.

A difference between the energization degradation value and the non-energization degradation value may be configured to increase following an increase of the number of charge-discharge cycles.

The mathematical model or the data table is configured so that the difference between the energization degradation value and the non-energization degradation value increases following the increase of the number of charge-discharge cycles when the estimation of the capacity degradation of the energy storage device based on the number of charge-discharge cycles is performed by using the mathematical model or the data table. In this way, the degradation of the energy storage device can be estimated more accurately than heretofore.

The estimating unit may estimate the energization degradation value by a sum of a film degradation value resulting from an SEI surface film that grows on a negative electrode of the energy storage device and a peeling degradation value resulting from an SEI surface film peeled off from the negative electrode.

In order to estimate the degradation of the energy storage device due to the energization, the inventor of the present invention has devised the mathematical model in which the breakage and regeneration of the SEI surface film on the negative electrode of the energy storage device are considered. It is conceived that this mathematical model represents the physical phenomenon in the electrode more correctly in comparison with the conventional mathematical models. The estimating unit estimates the energization degradation value by the sum of the film degradation value resulting from the SEI surface film that grows on the negative electrode of the energy storage device and the peeling degradation value resulting from the SEI surface film peeled off from the negative electrode, and can thereby estimate the degradation of the energy storage device more accurately than heretofore.

The degradation estimating device may further include an acquiring unit that acquires time-series data of an SOC in the energy storage device, wherein the estimating unit may estimate the energization degradation value based on the time-series data of the SOC.

The estimating unit estimates the energization degradation value based on the time-series data of the SOC, and can thereby estimate the degradation of the energy storage device more accurately than heretofore.

A degradation estimating method of an energy storage device according to another aspect of this invention acquires time-series data of an SOC in the energy storage device, and estimates degradation of the energy storage device based on a fluctuation magnitude of the SOC in the acquired time-series data.

A degradation estimating method according to another aspect of this invention estimates degradation of a capacity of an energy storage device based on a number of charge-discharge cycles, the capacity being an amount of electricity reversibly extractable from the energy storage device.

A computer program according to another aspect of this invention causes a computer to acquire time-series data of an SOC in an energy storage device, and to estimate degradation of the energy storage device based on a fluctuation magnitude of the SOC in the acquired time-series data.

A computer program according to another aspect of this invention causes a computer to execute processing of estimating degradation of a capacity of an energy storage device based on a number of charge-discharge cycles, the capacity being an amount of electricity reversibly extractable from the energy storage device.

The degradation estimating device according to the one aspect of this invention may be mounted on a battery management unit (BMU) or a cell monitoring unit (CMU), which is a monitoring device. The degradation estimating device may be a part of an energy storage apparatus into which such a monitoring device is incorporated. The degradation estimating device may be configured separately from the energy storage device and the energy storage apparatus, and at a time of the degradation estimation, may be connected to an energy storage apparatus including an energy storage device as a target of the degradation estimation. The degradation estimating device may remotely monitor the energy storage device and the energy storage apparatus.

The degradation estimating method according to the another aspect of this invention can be achieved by a variety of modes such as a recording medium that records a computer program for achieving this method.

Advantages of the Invention

As described above, the degradation of the energy storage device can be accurately estimated according to the aspects of the present invention.

MODE FOR CARRYING OUT THE INVENTION

First Embodiment

Figure 1:
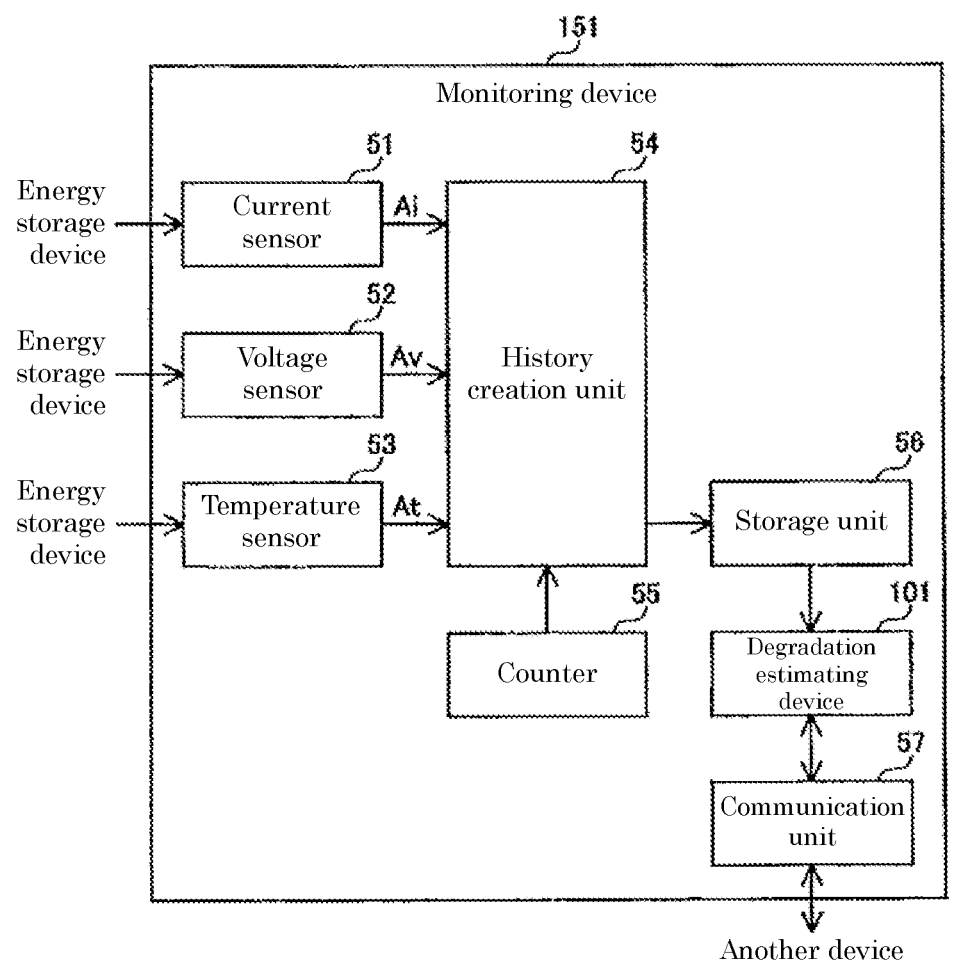
FIG. 1 is a diagram illustrating a configuration of a monitoring device.

A first embodiment of the present invention will be described below with reference to the drawings. Note that the same reference numerals are assigned to the same or equivalent portions in the drawings, and a description thereof will not be repeated. Moreover, at least a part of the below-described embodiments may be combined arbitrarily.

[Configuration and Basic Operation]

FIG. 1 is a diagram illustrating a configuration of a monitoring device. A monitoring device 151 includes a current sensor 51, a voltage sensor 52, a temperature sensor 53, a history creation unit 54, a counter 55, a storage unit 56, a communication unit 57, and a degradation estimating device 101.

A part of such constituents included in the monitoring device 151 may be disposed separately from other constituents. For example, the degradation estimating device 101 may be disposed at a remote place, and may communicate with the communication unit 57. Moreover, a server disposed at a remote place and connected to a network may function as the degradation estimating device 101.

The monitoring device 151 monitors degradation of an energy storage device (a lithium ion secondary battery in this embodiment) as a monitoring target. The monitoring device 151 may treat, as a monitoring target, a single battery cell as a monitoring target, or a plurality of battery cells (an assembled battery) connected in series or parallel. The monitoring device 151 may constitute an energy storage apparatus (a battery pack) together with the assembled battery.

The energy storage device as a monitoring target is not limited to a nonaqueous electrolyte secondary battery such as a lithium ion secondary battery, and may be other electrochemical cells to which later-described hypothesis, algorithm and mathematical model are adapted. Hereinafter, the energy storage device as a monitoring target is also referred to as a battery.

The counter 55 in the monitoring device 151 counts clock pulses generated by an oscillation circuit using a crystal oscillator, and the like, and holds a value thus counted. This count value may indicate a present time.

The current sensor 51 measures a current to be charged to the battery and a current to be discharged from the battery, and outputs an analog signal Ai, which indicates a measurement result, to the history creation unit 54.

The voltage sensor 52 measures a voltage between a positive electrode and a negative electrode in the battery, and outputs an analog signal Av, which indicates a measurement result, to the history creation unit 54.

The temperature sensor 53 measures a temperature T at a predetermined region of the battery, and outputs an analog signal At, which indicates a measurement result, to the history creation unit 54.

For example, every predetermined sampling time, the history creation unit 54 converts the analog signals Ai, Av and At, which are respectively received from the current sensor 51, the voltage sensor 52 and the temperature sensor 53, into digital signals Di, Dv and Dt.

The history creation unit 54 stores a count value of the counter 55 at a sampling time and the digital signals Di, Dv and Dt in the storage unit 56. In the storage unit 56, the sampling time, a current value, a voltage value and the temperature T are accumulated every sampling time.

The communication unit 57 may communicate with another device, for example, such as a main control device (main electronic control unit (ECU)) in a vehicle, a personal computer, a server, a smartphone and a terminal for battery maintenance.

For example, upon receiving a command to estimate a degraded state of the battery, the communication unit 57 outputs such a received estimation command to the degradation estimating device 101. Note that the monitoring device 151 may be configured not to include the respective sensors therein.

Figure 2:
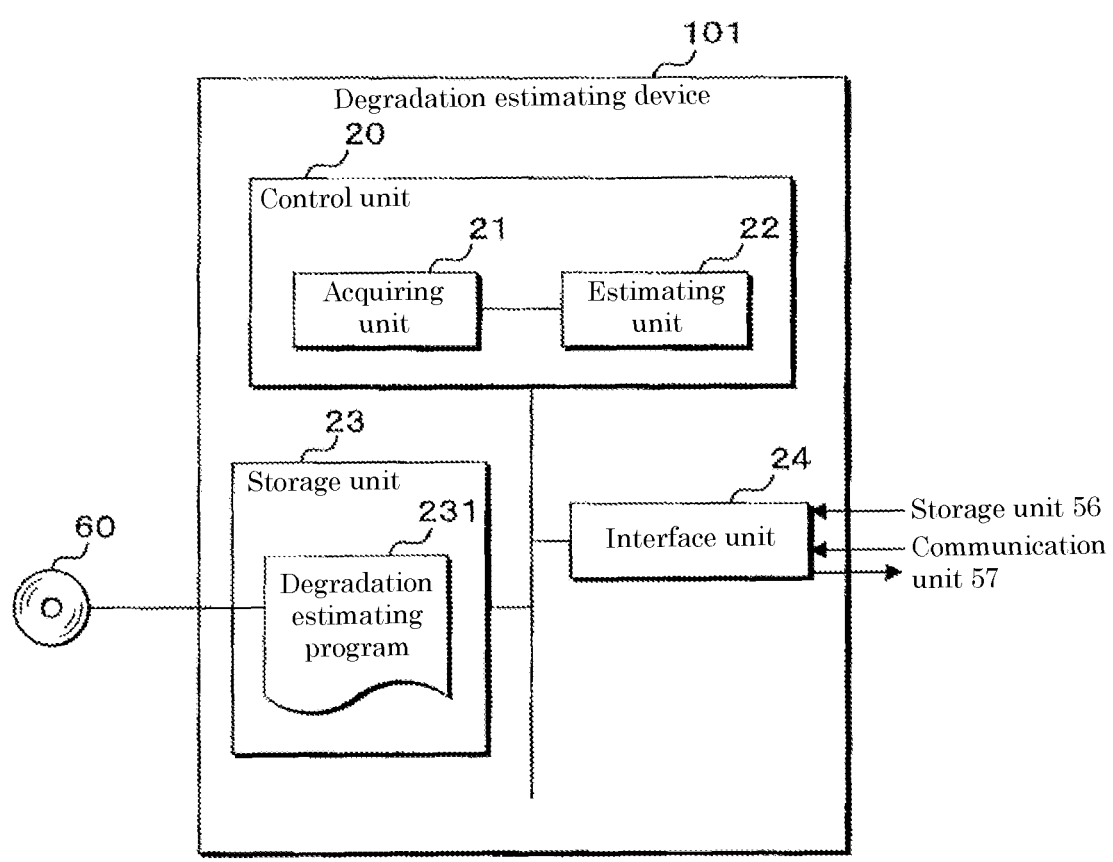
FIG. 2 is a diagram illustrating a configuration of a degradation estimating device.

FIG. 2 is a diagram illustrating a configuration of the degradation estimating device.

Referring to FIG. 2, the degradation estimating device 101 includes a control unit 20, a storage unit 23, an interface unit 24. The interface unit 24 is composed, for example, of a LAN interface, a USB interface or the like, and performs communication with another device, for example, such as the monitoring device 151 by wire or wirelessly.

A signal line or a terminal, which is directed from the degradation estimating device 101 to the communication unit 57, may function as an output unit that outputs an estimation result and the like. The communication unit 57 may function as the output unit.

When different input data is input to the degradation estimating device 101, a different output is obtained from the output unit. When a different SOC fluctuation range (and/or center SOC) is input to the degradation estimating device 101, the output unit may output a different output (for example, a voltage value, a duty ratio).

A display unit (or a reporting unit) that displays an output result may be connected to the output unit. The output may be passed via the communication unit 57 from the output unit, and may be displayed on the display unit (or the reporting unit).

The storage unit 23 stores a degradation estimating program 231 for executing later-described degradation estimation processing. The degradation estimating program 231 is provided, for example, in a state of being stored in a computer-readable recording medium 60 such as a CD-ROM, a DVD-ROM and a USB memory, and is stored in the storage unit 23 by being installed in the degradation estimating device 101. Moreover, the degradation estimating program 231 may be acquired from an external computer (not shown) connected to a communication network, and may be stored in the storage unit 23.

The storage unit 23 also stores data required at a time of the degradation estimation processing, and the like.

The control unit 20 is composed, for example, of a CPU, a ROM, a RAM and the like. The control unit 20 executes a computer program such as the degradation estimating program 231 read out from the storage unit 23, thereby controlling operations of the degradation estimating device 101.

The control unit 20 reads out and executes the degradation estimating program 231, thereby functioning as a processing unit that executes the degradation estimation processing.

Specifically, the control unit 20 includes an acquiring unit 21 and an estimating unit 22.

The acquiring unit 21 in the degradation estimating device 101 acquires time-series data of a state of charge (SOC) in the battery.

More specifically, upon receiving the estimation command from the communication unit 57, the acquiring unit 21 acquires respective pieces of sampling time, and current values, voltage values and temperatures T at the respective pieces of sampling time via the interface unit 24 from the storage unit 56 in the monitoring device 151 in accordance with the received estimation command.

As described above, from the storage unit 56, the acquiring unit 21 acquires data measured after the battery is started to be used.

Alternatively, the acquiring unit 21 may acquire data from a data file.

The acquiring unit 21 ensures a storage area for storing data regarding the sampling time, the SOC and the temperature.

The acquiring unit 21 ensures, for example, an array Ats having elements of ts[1] to ts[Snum], the array Ats serving for storing data regarding Snum pieces of sampling time.

Moreover, the acquiring unit 21 ensures an array Asoc having elements of sc[1] to sc[Snum], the array Asoc serving for storing data regarding the SOCs at the sampling time ts[1] to ts[Snum].

Furthermore, the acquiring unit 21 ensures an array Atmp having elements of tmp[1] to tmp[Snum], the array Atmp serving for storing data regarding the temperatures T at the sampling time ts[1] to ts[Snum].

For example, the acquiring unit 21 accumulates the current values at the respective pieces of sampling time, thereby calculating an amount of electricity conducted to the battery. Then, the acquiring unit 21 converts the calculated amount of electricity into a variation of the SOC. The acquiring unit 21 calculates the SOCs at the respective pieces of sampling time based on a conversion result. The acquiring unit 21 may correct the SOCs, for example, by using a measurement value of an open-circuit voltage.

The acquiring unit 21 stores pieces of sampling time, which correspond to the respective elements of the array Ats, so that indices N of the array Ats (where N is integers of 1 to Snum) are arrayed in time series.

The acquiring unit 21 stores the SOCs at the pieces of sampling time ts[1] to ts[Snum] respectively in sc[1] to sc[Snum]. Similarly, the acquiring unit 21 stores the temperatures T at the pieces of sampling time ts[1] to ts[Snum] respectively in tmp[1] to tmp[Snum].

The acquiring unit 21 outputs the arrays Ats, Asoc and Atmp to the estimating unit 22.

Figure 3:
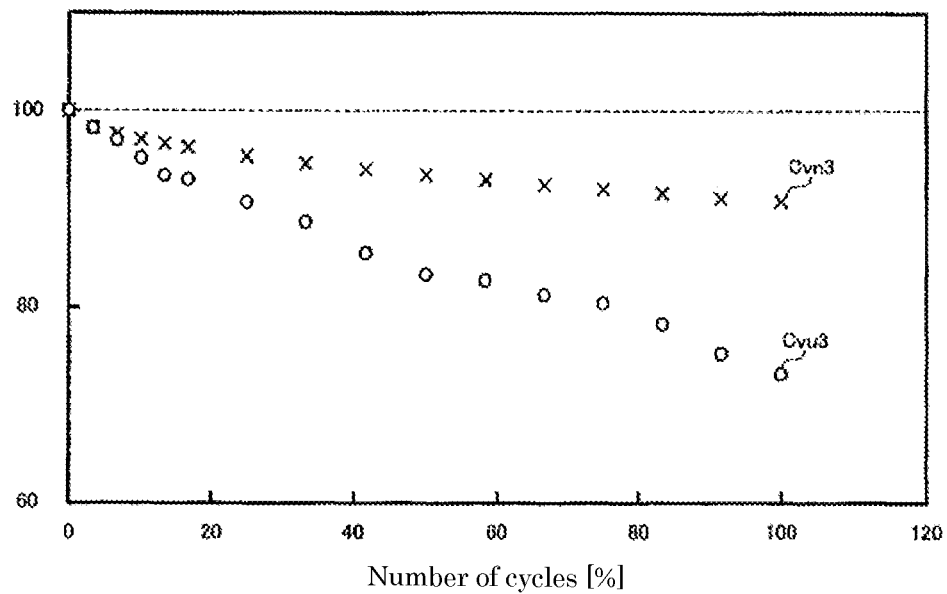
FIG. 3 is a diagram for explaining battery degradation estimated by the degradation estimating device.

FIG. 3 is a diagram for explaining battery degradation estimated by the degradation estimating device. In FIG. 3, an axis of ordinate represents, by percentages, capacities of a battery when a battery capacity at a time when the battery is new is taken as a reference, and an axis of abscissa represents, by percentages, the numbers of cycles when the total number of cycles as the total number of charges and discharges is taken as a reference. It is also possible to regard the axis of abscissa as an elapsed time from a state where the battery is new.

Referring to FIG. 3, a capacity change Cvu3 is a change (true cycle capacity fading) of the capacity with respect to the number of cycles when the battery is charged and discharged, and is a result obtained by an energization test. A capacity change Cvn3 is a temporal change (calendar capacity fading) of the capacity when the battery is not energized, and is a result obtained in advance based on a shelf test.

As seen, when the battery is energized, a degree of the degradation increases in comparison with when the battery is left. It is possible to regard a difference between the capacity indicated by the capacity change Cvu3 and the capacity indicated by the capacity change Cvn3 as degradation of the battery due to the energization. In other words, the degradation of the battery is a sum obtained by adding the degradation of the battery due to the energization to such degradation of the battery, which is not due to the energization.

[Shift of Capacity Balance]

Figure 4:
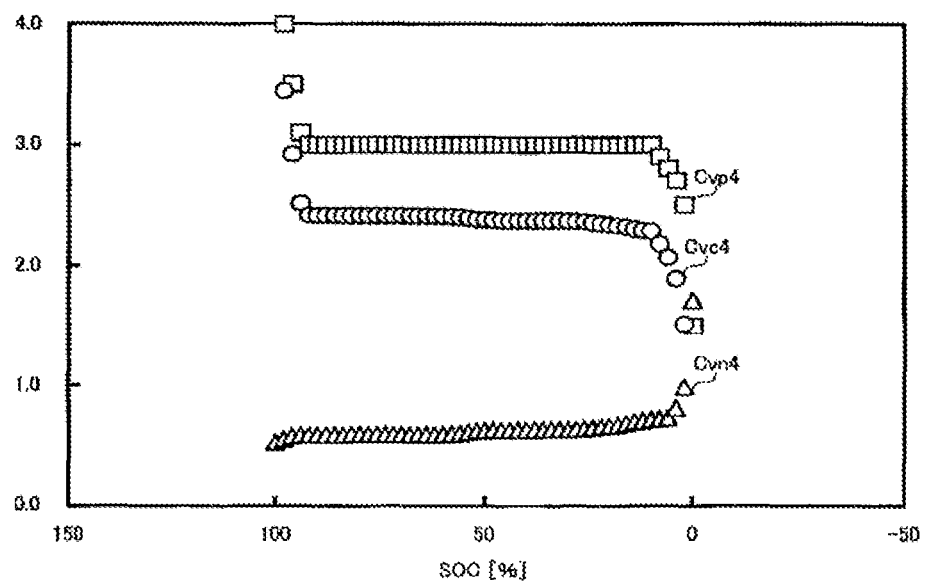
FIG. 4 is a diagram for explaining SOC-α curves in a new battery.

FIG. 4 is a diagram for explaining SOC-P curves (SOC-V curves) in a new battery. In FIG. 4, an axis of ordinate represents a potential, and an axis of abscissa represents an SOC.

FIG. 4 illustrates a change Cvp4 of a potential of a single positive electrode with respect to the SOC in the new battery, and a change Cvn4 of a potential of a single negative electrode with respect to the SOC therein. A difference between the potential of the single positive electrode and the potential of the single negative electrode is an inter-electrode voltage (battery voltage) in the battery. A change Cvc4 is a change of the inter-electrode voltage with respect to the SOC.

Figure 5:
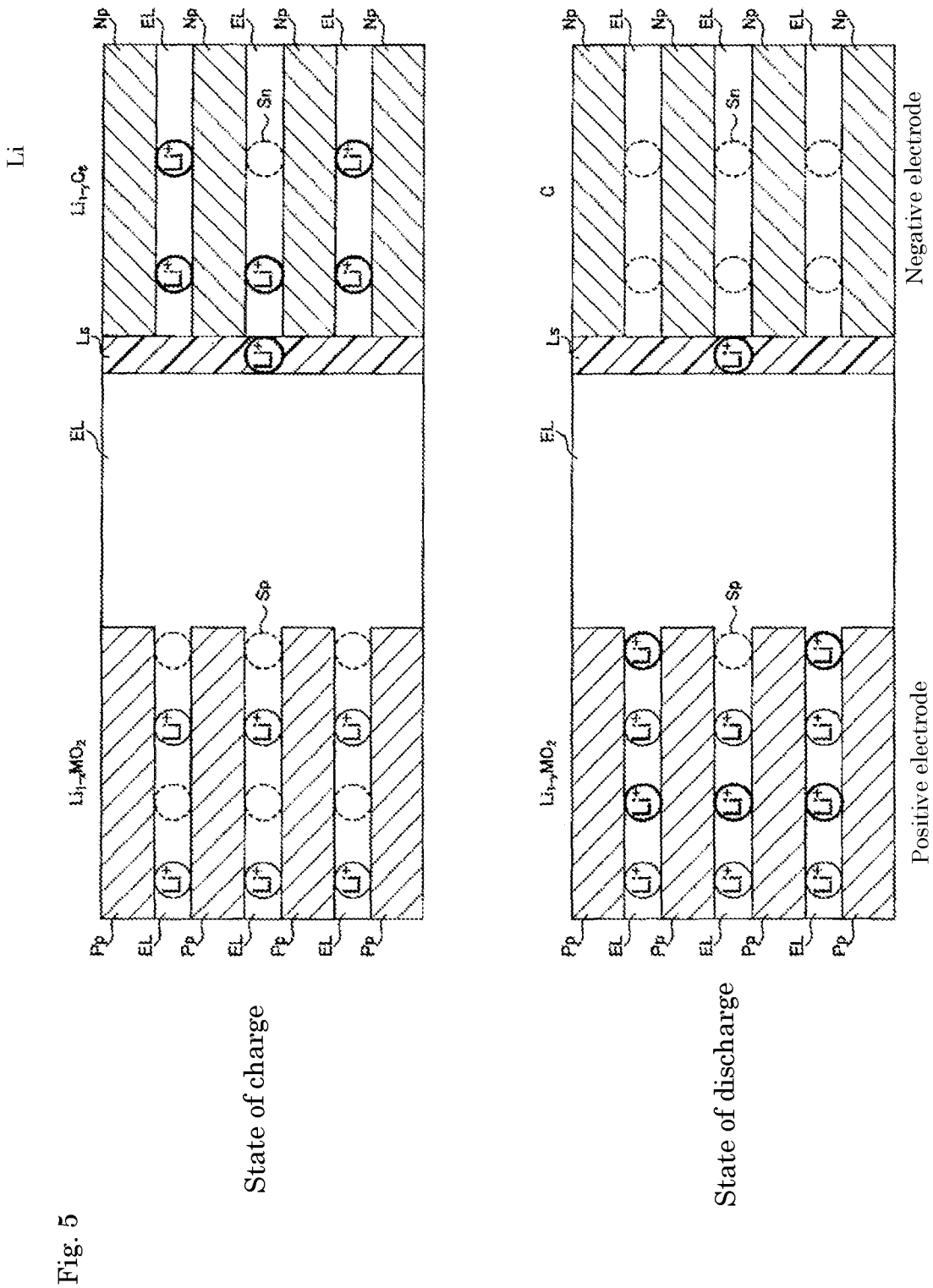
FIG. 5 is diagrams schematically representing movement of carriers in the battery.

FIG. 5 is diagrams schematically representing movement of carriers in the lithium ion secondary battery. Positive electrodes Pp formed of a lithium metal oxide and negative electrodes Np formed of carbon are immersed in an electrolyte solution EL. In the positive electrodes Pp, a plurality of sites Sp capable of accommodating lithium ions are present. In the negative electrodes Np, a plurality of sites Sn capable of accommodating the lithium ions are present.

Although being different from an illustrated state, in a state of discharge of the new battery, all the lithium ions are accommodated in the sites Sp in the positive electrodes Pp. When the battery is charged, a part of the lithium ions accommodated in the positive electrodes Pp moves to the negative electrodes Np via the electrolyte solution, and is accommodated in the sites Sn.

It is known that, as illustrated in FIG. 5, a solid electrolyte interface (SEI) surface film Ls is formed on surfaces of negative electrodes in a degraded battery. The SEI surface film Ls has a property to trap the lithium ions.

When the lithium ions are trapped by the SEI surface film Ls, sites Sp in which the lithium ions are not accommodated are generated in the state of discharge. Moreover, in the state of charge, the number of lithium ions accommodated in the sites Sn decreases in comparison with the case of the new battery.

Figure 6:
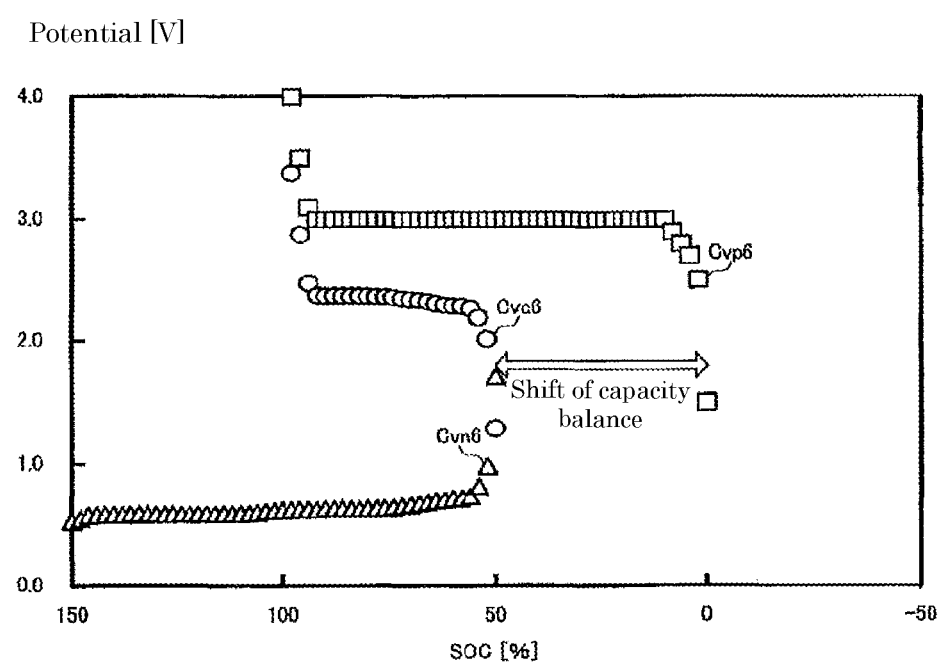
FIG. 6 is a diagram for explaining a shift of a capacity balance in the battery.

FIG. 6 is a diagram for explaining a shift of a capacity balance in the battery. The way of looking at FIG. 6 is similar to that for FIG. 4.

FIG. 6 illustrates, in the degraded battery, a change Cvp6 of a potential of a single positive electrode with respect to the SOC, a change Cvn6 of a potential of a single negative electrode with respect to the SOC, and a change Cvc6 of an inter-electrode voltage with respect to the SOC.

When the lithium ions are trapped by the SEI surface film Ls (see FIG. 5), the change of the potential of the single negative electrode with respect to the SOC shifts to a direction where the negative electrodes Np are not completely charged. Specifically, the change Cvn4 illustrated in FIG. 4 shifts to thereby turn to the Cvn6 illustrated in FIG. 6.

When such a shift occurs, the amount of electricity reversibly extractable from the battery decreases even if the capacities of the positive electrodes Pp and the negative electrodes Pn are not degraded. Hence, the battery capacity decreases.

This phenomenon and the battery capacity that decreases due to this phenomenon are defined as "shift of capacity balance" in this description.

In general, the above-described phenomenon occurs by the fact that side reaction rates in the positive electrodes Pp and the negative electrodes Pn differ from each other. It is argued that, when carbon is used for the negative electrodes Pn as mentioned above, the above-described phenomenon is caused by the SEI surface film Ls formed on the negative electrodes Pn.

[New Finding 1]

Figure 7:
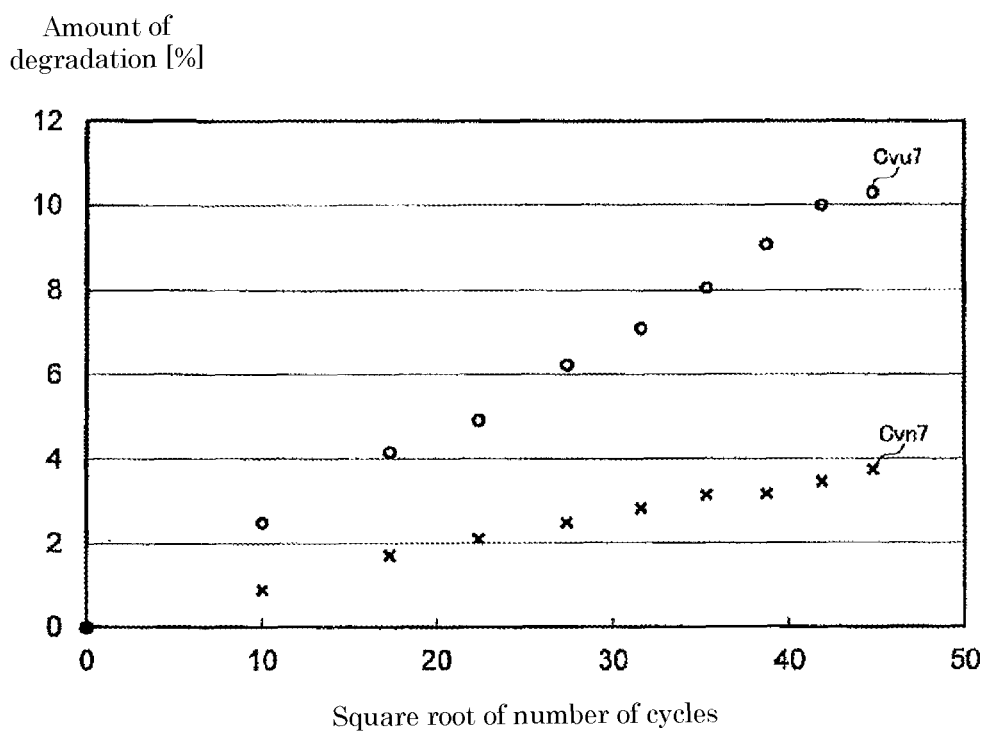
FIG. 7 is a diagram for explaining the shift of the capacity balance in the battery.

FIG. 7 is a diagram for explaining the shift of the capacity balance in the battery. In FIG. 7, an axis of ordinate represents an amount of degradation, and an axis of abscissa represents a square root of the number of cycles. It is also possible to regard the axis of abscissa as a square root of an elapsed time from a state where the battery is new.

Referring to FIG. 7, Cvu7 is a change of a measured value of the shift of the capacity balance when the battery is charged and discharged with respect to the square root of the number of cycles. Cvn7 is a change of an estimated value of the shift of the capacity balance when the battery is not charged or discharged. That is, the former one is a transition of the shift of the capacity balance at the time of energization, and the latter one is a chronological transition of the shift of the capacity balance at the time of non-energization The latter one can be obtained as follows. First, a shelf test was performed for a plurality of batteries different in SOC and temperature, whereby a calendar capacity fading amount (a non-energization degradation value Qcnd to be described later) at each SOC and each temperature is obtained. Moreover, a coefficient at each SOC and each temperature is obtained by using later-described Equation (2) or Equation (3). Next, from each SOC in a cycle test, a square root of a time (for example, a minute time) while the battery resides in the SOC, and the corresponding coefficient obtained in advance, a calendar capacity fading amount in the minute time during the cycle test is obtained at a predetermined time interval. A plurality of the calendar capacity fading amounts are accumulated, whereby the calendar capacity fading amount in the cycle test is calculated.

In the lithium ion secondary battery, it is known that the SEI surface film grows on the negative electrode. As the SEI surface film grows, an amount of the lithium ions trapped by the SEI surface film increases, whereby the shift of the capacity balance increases.

In other words, as the SEI surface film grows, there shifts a balance between an amount of lithium ions inserted and removed in the negative electrodes and an amount of lithium ions inserted and removed in the positive electrodes.

Heretofore, it has been known that the SEI surface film grows also when the battery is not energized, and that the battery degrades like the change Cvn7 of the amount of degradation. That is, it has been known that, also when the battery is not energized, the battery degrades due to the temporal shift of the capacity balance.

According to an experiment performed by the inventor of the present invention, as illustrated in Cvu7 of FIG. 7, as the number of cycles increased, the shift of the capacity balance increased when the battery was energized more in comparison with when the battery was not energized. From this fact, the inventor of the present invention has found that the shift of the capacity balance further increases due to the energization. This fact is new finding unpredictable from the heretofore known theories and laws. The shift of the capacity balance increases as the number of cycles increases, and it is therefore inferred that a generated amount of the SEI surface film on the negative active material increases due to the energization. The SEI surface film is generated since a decomposition reaction on the negative active material occurs, and the growth thereof slows down when a film thickness thereof increases. Accordingly, it is reported that, at the time of non-energization, the generated amount of the SEI surface film, that is, the shift of the capacity balance is gradually saturated. From the above, the following can be conceived. That is, the negative active material expands and contracts due to the energization, whereby the SEI surface film is broken and peeled off from the active material. Thus, the SEI surface film continues to be regenerated without slowdown of the growth thereof. Therefore, an excessive amount of the SEI surface film is generated more than at the time of non-energization.

[New Finding 2]

Figure 8:
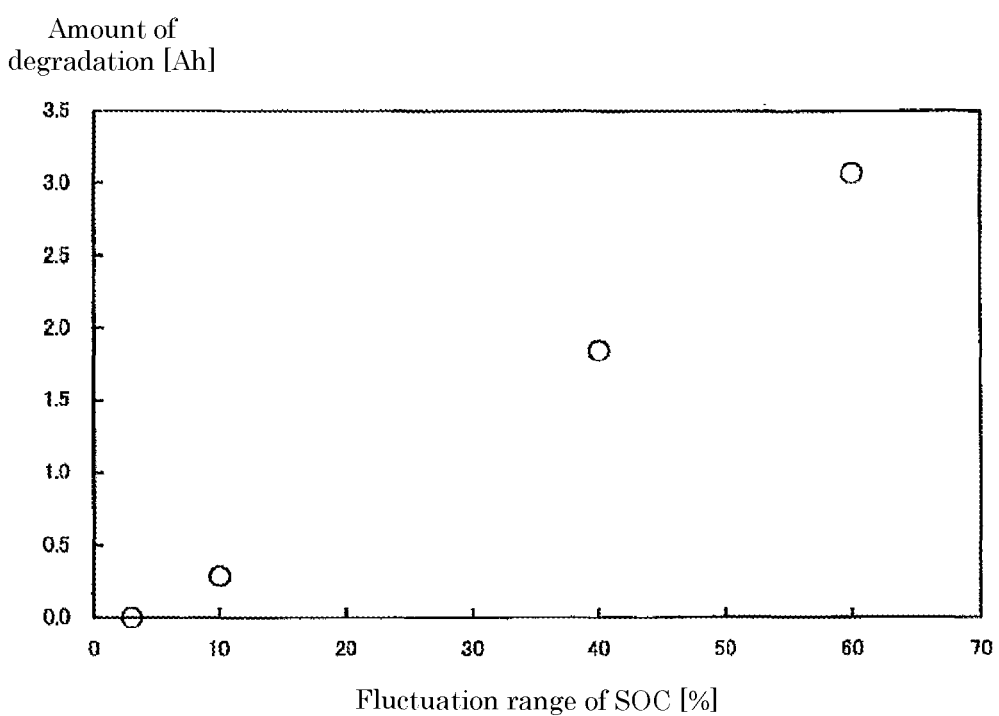
FIG. 8 is a diagram illustrating an example of a change of an amount of degradation of the battery due to energization with respect to a fluctuation range of an SOC.

FIG. 8 is a diagram illustrating an example of a change of the amount of degradation of the battery due to the energization with respect to the fluctuation range of the SOC. In FIG. 8, an axis of ordinate represents a difference between an amount of degradation when the battery is energized with a predetermined amount of electricity and an amount of degradation in an SOC fluctuation range of 3%, and an axis of abscissa represents the fluctuation range of the SOC.

In FIG. 8, amounts of degradation due to the energization after the charge-discharge is repeated a predetermined number of times so that the center SOC became 60% are plotted with respect to the fluctuation range of the SOC.

As illustrated in FIG. 8, the inventor of the present invention has found that the amount of degradation due to the energization changes when the fluctuation range of the SOC differs even if the center SOC is the same. The inventor of the present invention has found that the degradation due to the energization increases in response to the fluctuation magnitude of the SOC.

A mechanism of this phenomenon is not sufficiently figured out, yet. The inventor of the present invention considers that the expansion (charged time) and contraction (discharged time) of the negative electrodes become significant as the fluctuation magnitude of the SOC is larger, thus the SEI surface film formed on the surfaces of the negative electrodes is partially broken, resulting in that the amount of degradation of the battery due to the energization increases.

[New Finding 3]

Figure 9:
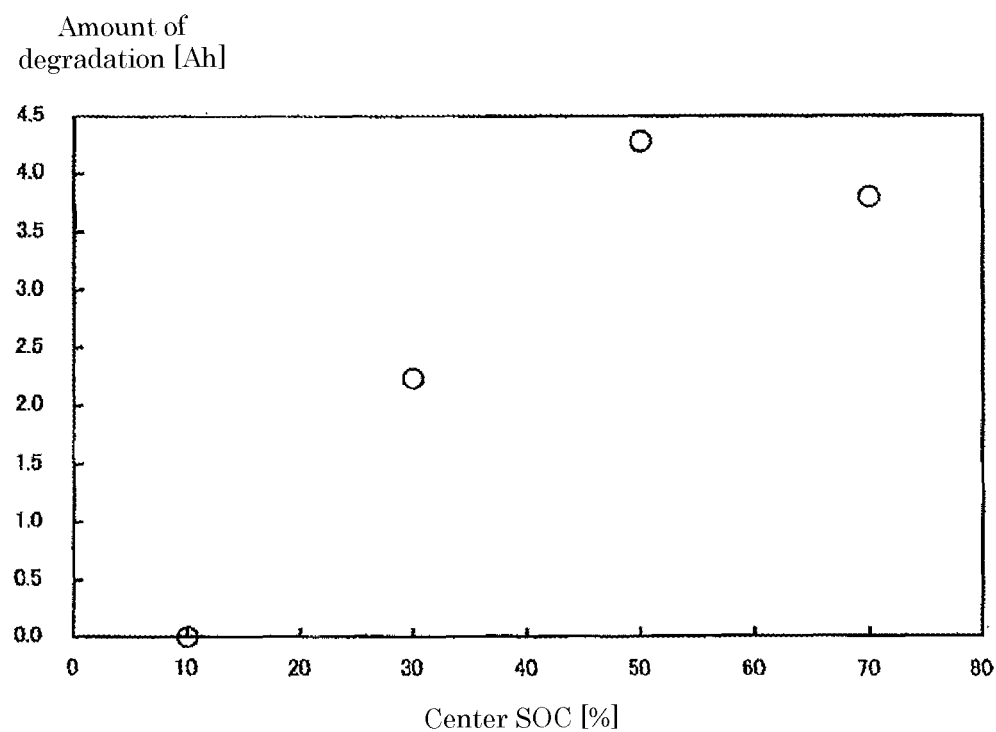
FIG. 9 is a diagram illustrating an example of a change of the amount of degradation of the battery due to the energization with respect to a center SOC.

FIG. 9 is a diagram illustrating an example of a change of the amount of degradation of the battery due to the energization with respect to the center SOC. In FIG. 9, an axis of ordinate represents a difference between the amount of degradation when the battery is energized with a predetermined amount of electricity and an amount of degradation in a center SOC of 10%, and an axis of abscissa represents the center SOC as a fluctuation center of the SOC. Herein, the center SOC is an example of a fluctuation center of the SOC in the time-series data of the SOC.

In FIG. 9, amounts of degradation due to the energization after the charge-discharge is repeated a predetermined number of times so that the fluctuation range of the SOC became 20% are plotted with respect to the center SOC.

Herein, charge-discharge operations will be described by taking an example. The repetition of the charge-discharge so that the center SOC is 10% and the fluctuation range of the SOC becomes 20% means repetition of charge-discharge so that the SOC goes back and forth within a range from 0% to 20%.

As illustrated in FIG. 9, the inventor of the present invention has found that the amount of degradation due to the energization changes when the center SOC differs even if the fluctuation range of the SOC is the same. The inventor of the present invention has found that a degree of progress of the degradation due to the energization differs in response to the center SOC. Though the SOC fluctuation range is the same, the amount of degradation is smaller when the center SOC is low (for example, when the center SOC is 10%) in comparison with when the center SOC is around 50%. Though the SOC fluctuation range is the same, the amount of degradation is smaller when the center SOC is high (for example, when the center SOC is 70%) in comparison with when the center SOC is around 50%.

[Ideas Regarding New Mathematical Model]

Based on the above-mentioned new findings 1 to 3, the inventor of the present invention obtained the following ideas regarding new mathematical models for estimating the degradation of the energy storage device due to the energization.

(A) For the mathematical model, to adopt the breakage and regeneration of the SEI surface film in the negative electrodes Together with the finding that a growth rate of the SEI surface film decreases as the SEI surface film is formed, an original idea that the growth rate returns to the beginning at a spot where the SEI surface film is broken is expressed by a mathematical model.

(B) To increase the amount of degradation of the energy storage device due to the energization as the fluctuation magnitude of the SOC is larger.

(C) To impart SOC dependency to the coefficient (to differentiate a coefficient value in response to the center SOC and/or the SOC fluctuation range).

(D) In the mathematical model, to also consider the degradation of the energy storage device due to the energization, the degradation being caused by the SEI surface film broken and peeled off from the negative electrodes of the energy storage device.

This mathematical model is formed by considering that ions as those in charge of loading and unloading the electrical energy enter and exit through the surface film (SEI surface film) on the electrode surfaces. More specifically, this mathematical model is a degradation estimation model formed by considering ions present in the surface film, and further, also considering ions included in the surface film peeled off from the electrode surfaces following the charge-discharge.

[Calculation Processing for Non-Energization Degradation Value Qcnd]

Referring to FIG. 2 again, the estimating unit 22 estimates the degradation of the battery based on the fluctuation magnitude of the SOC in the time-series data of the SOC, which is acquired by the acquiring unit 21.

For example, the estimating unit 22 estimates the degradation of the battery based on the sum of the energization degradation value Qcur and the non-energization degradation value Qcnd. Specifically, as illustrated in the following Equation (1), the estimating unit 22 calculates the sum of the energization degradation value Qcur and the non-energization degradation value Qcnd as a degradation value Qdeg indicating the degradation of the battery.

[Equation 1]

$$Q_{deg} = Q_{cnd} + Q_{cur} \quad (1)$$
$$= Q_{cnd} + Q_{rgn} + Q_{dst}$$

The estimating unit 22 may transmit estimation result information, which indicates the calculated degradation value Qdeg, as a response to the estimation command, to another device via the communication unit 57.

The estimating unit 22 is configured to estimate, as the degradation of the battery, the degradation value Qdeg that is the sum of the energization degradation value Qcur and the non-energization degradation value Qcnd; however, is not limited to this. The estimating unit 22 may be configured to estimate, as the degradation of the battery, a value based on the above-described sum, a percentage value with respect to a predetermined reference of the degradation value Qdeg, a degradation level corresponding to the degradation value Qdeg, or the like. Qcur is composed of at least Qrgn and Qdst. Specifically, Qcur includes a film degradation value Qrgn resulting from the SEI surface film that grows on the negative electrodes and a peeling degradation value Qdst resulting from the SEI surface film peeled off from the negative electrodes. Qrgn is a degradation value resulting from a surface film newly formed on the electrodes after the SEI surface film is peeled off due to the SOC fluctuation, and Qdst is a degradation value resulting from the surface film peeled off due to the SOC fluctuation.

The non-energization degradation value Qcnd increases with the elapse of time. For example, an increment dQcnd per minute time dt of the non-energization degradation value Qcnd is calculated by the following Equation (2).

[Equation 2]

$$\frac{dQ_{cnd}}{dt} = \frac{k_c(SOC, T)}{Q_{cnd}} \quad (2)$$

Herein, the coefficient kc is a function of the SOC and the temperature T. Equation (3) is obtained by deforming Equation (2).

[Equation 3]

$$Q_{cnd} = k_{cr}(SOC, T) \times \sqrt{t} \quad (3)$$

Herein, t indicates an elapsed time, and kcr=√(2×kc) is established. Hence, the non-energization degradation value Qcnd increases according to the root rule. The increase according to the root rule means a gradual decrease of the increment of the non-energization degradation value Qcnd per unit time, the gradual decrease following the elapse of time. The estimating unit 22 calculates the non-energization degradation value Qcnd by using at least one of Equation (2) and Equation (3).

[Calculation Processing for Energization Degradation Value Qcur]

The estimating unit 22 estimates the degradation of the battery due to the energization, for example, based on a change of a state of the film on the electrodes of the battery, the change being base based on the fluctuation magnitude of the SOC.

In this embodiment, the estimating unit 22 estimates the degradation of the battery due to the energization also in consideration of the peeling degradation value resulting from the surface film peeled off from the electrodes of the battery.

More specifically, the estimating unit 22 calculates a sum of the film degradation value and the peeling degradation value, which result from the surface film on the electrodes in the battery, as the energization degradation value Qcur.

As illustrated in Equation (1), the estimating unit 22 calculates a sum of the film degradation value Qrgn and the peeling degradation value Qdst as the energization degradation value Qcur. Herein, the film degradation value Qrgn results from the SEI surface film that grows on the negative electrodes in the lithium ion secondary battery, and the peeling degradation value Qdst results from the SEI surface film peeled off from the negative electrodes.

The storage unit 23 holds a correspondence relationship between the SOC and a coefficient kr (see later-described Equation (4)) that is a degradation coefficient indicating the degree of progress of the degradation of the battery due to the energization. The storage unit 23 may store a correspondence table Tblr that indicates a correspondence relationship between the SOC, the temperature T and the coefficient kr.

For example, a temporal change of the amount of degradation due to the energization for each temperature T and for each SOC is measured by a test performed in advance.

The coefficient kr is calculated based on a measurement result of the test. Specifically, it is desirable that the coefficient kr be collated with the measurement result together with elements of an array for calculating later-described divided degradation values, and be obtained by an optimization calculation.

Moreover, the storage unit 23 holds a correspondence relationship between the SOC and a degradation coefficient (above-mentioned coefficient kc) indicating a degree of progress of the degradation of the battery, which is not due to the energization. The storage unit 23 may store a correspondence table Tblc that indicates a correspondence relationship between the SOC, the temperature T and the coefficient kc.

The correspondence relationship between the SOC, the temperature T and the coefficient kc is derived, for example, by performing a similar test to that for the calculation of the coefficient kr.

For example, the estimating unit 22 increases the film degradation value Qrgn with the elapse of time. The estimating unit 22 calculates the film degradation value Qrgn, for example, so that the increase of the film degradation value Qrgn decreases in response to a magnitude of the film degradation value Qrgn, and so that the increase increases in response to the coefficient kr corresponding to the SOC.

Specifically, an increment dQrgn of the film degradation value Qrgn per minute time dt is calculated by the following Equation (4).

[Equation 4]

$$\frac{dQ_{rgn}}{dt} = \frac{k_r(SOC, T)}{Q_{rgn}} \quad (4)$$

The following Equation (5) is obtained by deforming Equation (4).

[Equation 5]

$$Q_{rgn} = k_{rr}(SOC,T) \times \sqrt{t} \quad (5)$$

Herein, krr=√(2×kr) is established. Hence, the film degradation value Qrgn increases according to the root rule. The increase according to the root rule means a gradual decrease of the increment of the film degradation value Qrgn per unit time, the gradual decrease following the elapse of time. The estimating unit 22 calculates the film degradation value Qrgn by using at least one of Equation (4) and Equation (5).

Figure 10:
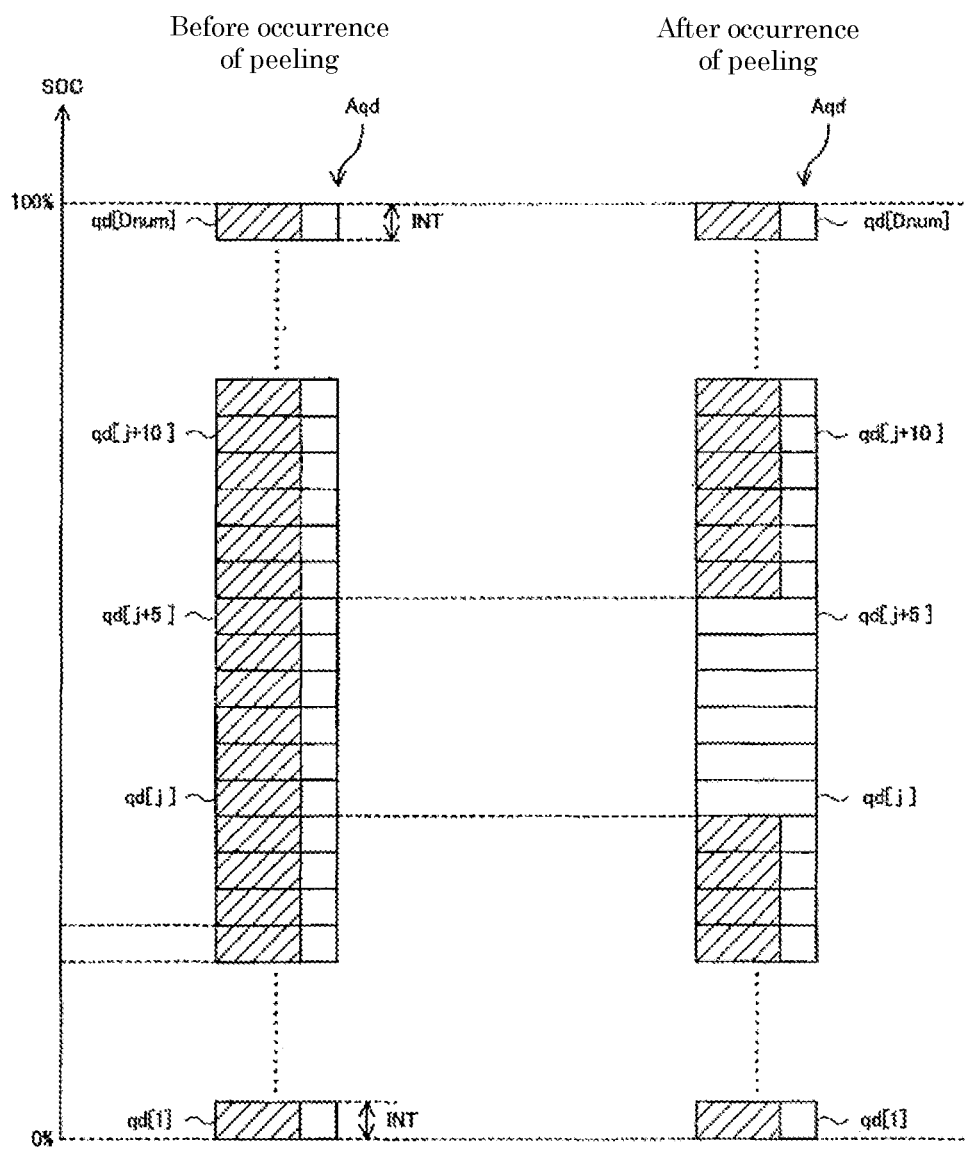
FIG. 10 is a diagram illustrating an example of an array to be used by an estimating unit in the degradation estimating device.

FIG. 10 is a diagram illustrating an example of the array to be used by the estimating unit in the degradation estimating device. In FIG. 10, an axis of ordinate is a virtual axis indicating both of the center SOC and the SOC fluctuation range. A left side of FIG. 10 represents a state before the peeling of the SEI surface film occurs, and a right side of FIG. 10 represents a state after the peeling of the SEI surface film occurs. FIG. 10 illustrates a situation where there occurs a fluctuation of the SOC, which is larger than 12% and equal to or smaller than 14% when a certain SOC (an SOC value between qd[j+2] and qd[j+3]) is taken as a center as will be described later. The estimating unit 22 calculates the film degradation value Qrgn, for example, by a sum of a plurality of the divided degradation values.

Specifically, the estimating unit 22 ensures a storage area for storing the divided degradation values.

The estimating unit 22 ensures an array Aqd having elements of qd[1] to qd[Dnum] for storing Dnum pieces of the divided degradation values.

Herein, the number of elements Dnum of the array Aqd is, for example, a value obtained by dividing 100% by an interval INT. The interval INT is an arbitrarily settable value, and in this example, the interval INT is 2. Hence, Dnum is 50 in this example.

For example, the estimating unit 22 increases each of the plurality of divided degradation values with the elapse of time. For example, the estimating unit 22 calculates a divided degradation value qd[j] so that a growth rate of the divided degradation value qd[j] becomes small (so that the growth rate of the divided degradation value gradually decreases) in response to growth of the divided degradation value qd[j]. Herein, an index j is an integer of 1 to Dnum.

Specifically, by using the following Equation (6) based on Equation (4), the estimating unit 22 calculates an increment Δ(Sj[N]) of the divided degradation value qd[j] between a sampling time ts[N−1] and a sampling time ts[N].

[Equation 6]

$$\Delta S_j[N] = \\ k_r(sc[N], tmp[N]) \times \left[ \sqrt{\left\{ f\left(\sum_{k=1}^{N-1} \Delta S_j[k]\right)\right\}^2 + \Delta t} - f\left(\sum_{k=1}^{N-1} \Delta S_j[k]\right) \right] \quad (6)$$

Herein, Δt is an interval between the sampling time ts[N−1] and the sampling time ts[N]. The coefficient kr(sc[N],tmp[N]) is a coefficient corresponding to sc[N] and a temperature tmp[N] at the sampling time ts[N], and it is possible to calculate the coefficient kr(sc[N],tmp[N]) based on the correspondence table Tblr. Equation (6) integrates a previous degradation history (degradation paths) from the beginning to N−1, and based on this integration, newly obtains an increment (a change value) of a Δ(Sj[N]) divided degradation value qd[j], which is an amount of increase for a time (Δt) from N−1 to N that is next sampling timing, according to the root rule. Moreover, the function f of Equation (6) is represented by the following Equation (7).

[Equation 7]

$$f\left(\sum_{k=1}^{N-1} \Delta S_j[k]\right) = \frac{\sum_{k=1}^{N-1} \Delta S_j[k]}{k_r(sc[N], tmp[N])} \quad (7)$$

Moreover, the divided degradation value qd[j] at the sampling time ts[N−1] by qd[j][N−1], thus making it possible to deform Equation (7) to the following Equation (8).

[Equation 8]

$$f\left(\sum_{k=1}^{N-1} \Delta S_j[k]\right) = \frac{q_d[j][N-1]}{k_r(sc[N], tmp[N])} \quad (8)$$

Δ(Sj[N]) becomes smaller as the divided degradation value qd[j] at the sampling time ts[N−1] is smaller. In other words, Δ(Sj[N]) becomes larger as the divided degradation value qd[j] at the sampling time ts[N−1] is larger.

The estimating unit 22 adds Δ(Sj[N]) to qd[j][N−1], thereby calculating the divided degradation value qd[j] at the sampling time ts[N].

As illustrated in the array Aqd before the occurrence of the peeling in FIG. 10, values calculated by the estimating unit 22 until the occurrence of the peeling are illustrated by hatching in the respective divided degradation values qd[1] to qd[Dnum].

The estimating unit 22 estimates the degradation of the battery by performing the following processing. For example, when the fluctuation magnitude of the SOC satisfies a predetermined condition C1, the estimating unit 22 adds, to the peeling degradation value Qdst, divided degradation values of which number corresponds to the fluctuation magnitude among the plurality of divided degradation values, and in addition, sets the respective divided degradation values, which are used to be added to the peeling degradation value Qdst, to predetermined values smaller than the divided degradation values.

Specifically, the predetermined condition C1 is that, for example, the fluctuation magnitude of the SOC becomes larger than the interval INT. In the example illustrated in FIG. 10, there is shown a situation where the fluctuation of the SOC, which is larger than 12% and equal to or smaller than 14%, occurs, and the peeling of the SEI surface film occurs. In this case, since the fluctuation magnitude of the SOC is larger than the interval INT, in other words, larger than 2, the predetermined condition C1 is satisfied.

When the predetermined condition C1 is satisfied, the estimating unit 22 adds, to the peeling degradation value Qdst, a sum of the values as the divided degradation values qd[j] to qd[j+5] before the occurrence of the peeling. Herein, the index j is, for example, a value in which an SOC immediately before the fluctuation is larger than (j−1)×INT, and this SOC becomes equal to or less than j×INT.

Then, as illustrated in the array Aqd after the occurrence of the peeling, the estimating unit 22 sets each of the values as the divided degradation values qd[j] to qd[j+5] to zero.

The estimating unit 22 is not limited to the configuration of setting each of the values as the divided degradation values qd[j] to qd[j+5] to zero, and may be configured to set each of the values as the divided degradation values qd[j] to qd[j+5] to a predetermined value other than zero if the predetermined value is smaller than the values.

[Flow of Operations]

The monitoring device 151 or the degradation estimating device 101 in the monitoring device 151 includes the control unit 20. The control unit 20 reads out, from the storage unit 23, the degradation estimating program 231 including a part or all of steps of a flowchart to be shown below, and executes the degradation estimating program 231.

Figure 11:
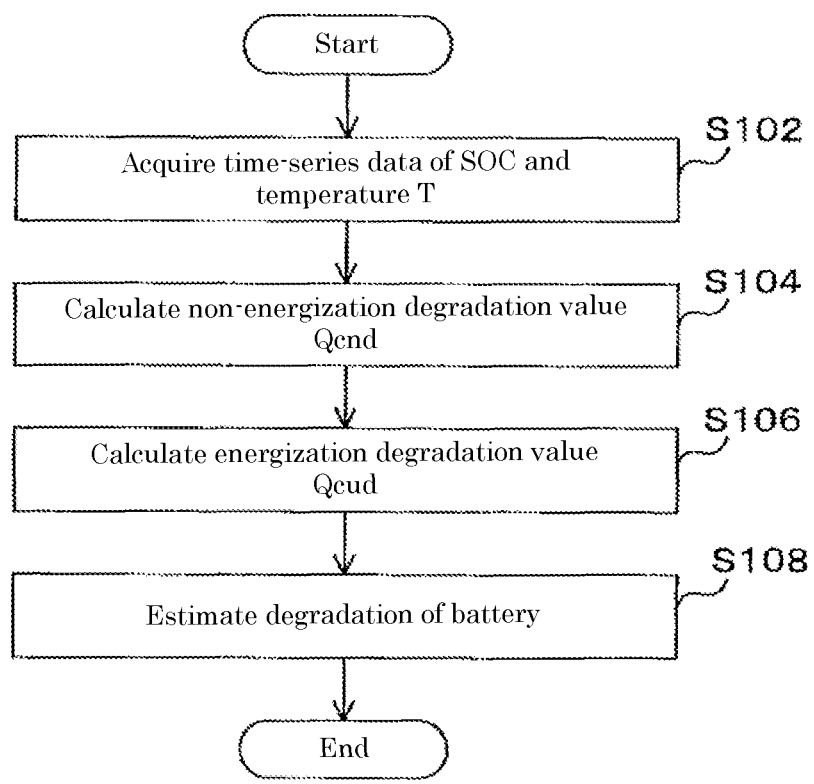
FIG. 11 is a flowchart illustrating an operation procedure when the degradation estimating device performs estimation for the battery degradation.

FIG. 11 is a flowchart in which an operation procedure when the degradation estimating device performs the estimation for the battery degradation is determined.

Referring to FIG. 11, a situation where the control unit 20 of the degradation estimating device 101 receives the estimation command from another device is assumed.

First, the degradation estimating device 101 acquires the time-series data of the SOC and the temperature T in the battery (Step S102).

Next, the degradation estimating device 101 calculates the non-energization degradation value Qcnd of the battery based on the time-series data of the SOC and the temperature T (Step S104).

The degradation estimating device 101 calculates the energization degradation value Qcur of the battery based on the time-series data of the SOC and the temperature T (Step S106).

The degradation estimating device 101 calculates the sum of the energization degradation value Qcur and the non-energization degradation value Qcnd as the degradation value Qdeg indicating the degradation of the battery, and estimates the degradation of the battery based on a result of the calculation (Step S108).

An order of the above-described Steps S104 and S106 is not limited to the above-described one, and the order may be changed.

Figure 12:
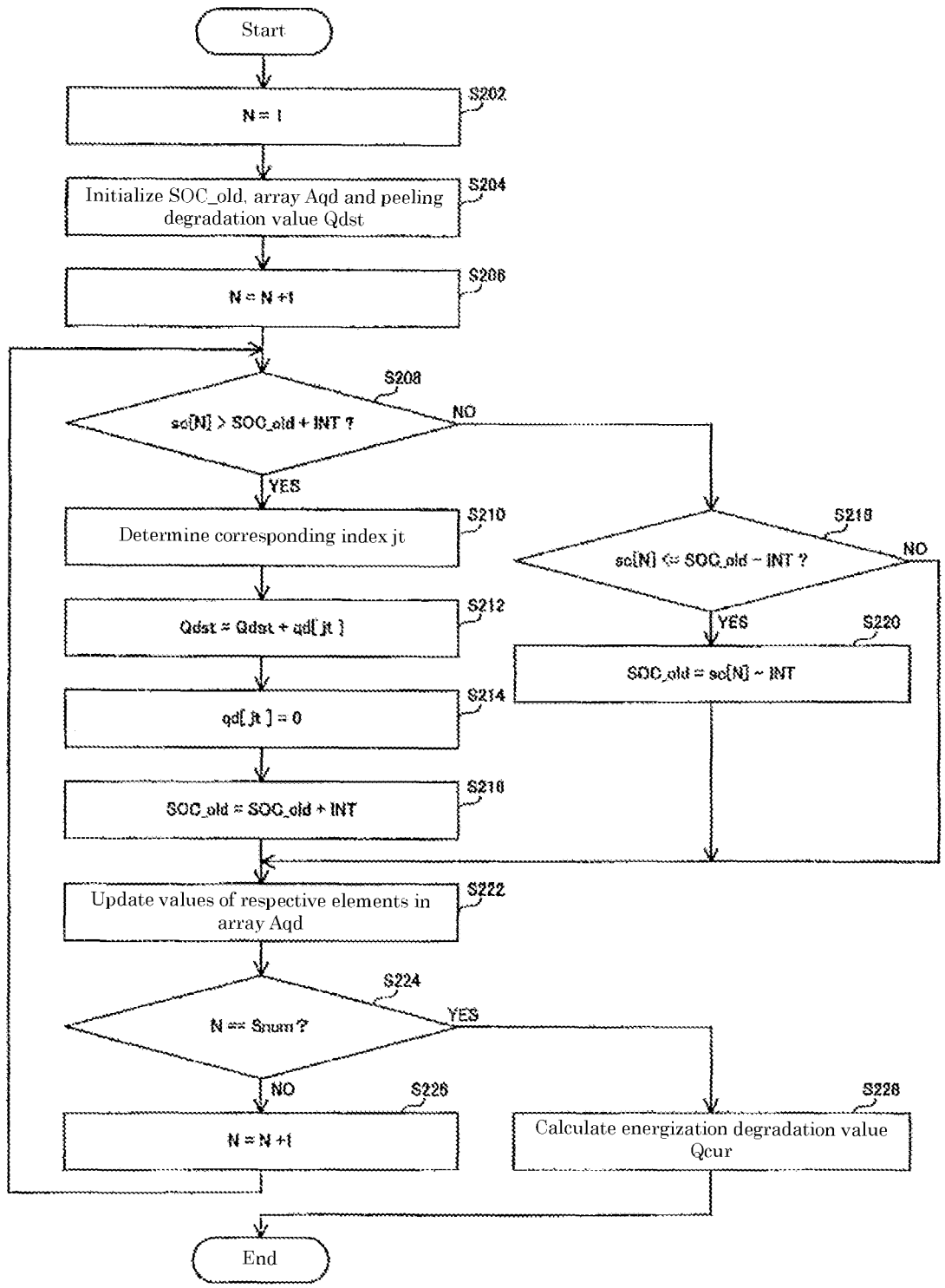
FIG. 12 is a flowchart illustrating an operation procedure when the degradation estimating device performs calculation for an energization degradation value based on time-series data.

FIG. 12 is a flowchart in which an operation procedure when the degradation estimating device performs the calculation for the energization degradation value based on the time-series data is determined. FIG. 12 illustrates details of the operation in Step S106 of FIG. 11. In this example, unlike the case illustrated in FIG. 9, there is assumed such a sampling interval in which a fluctuation range of the SOC at a sampling interval becomes smaller than the interval INT.

First, the degradation estimating device 101 initializes the index N to 1 (Step S202).

Next, the degradation estimating device 101 initializes SOC_old, the array Aqd and the peeling degradation value Qdst. Specifically, the degradation estimating device 101 sets the SOC_old to sc[1]. Moreover, the degradation estimating device 101 initializes the values of the elements qd[1] to qd[Dnum] in the array Aqd and of the peeling degradation value Qdst to zero (Step S204).

The degradation estimating device 101 increments the index N (Step S206).

When the sc[N] is larger than the sum of the SOC_old and the interval INT (YES in Step S208), the degradation estimating device 101 determines an index jt corresponding to the fluctuation magnitude of the SOC (Step S210).

For example, the degradation estimating device 101 determines such an index jt in which the SOC_old is larger than (jt−1)×INT and the SOC_old becomes equal to or less than jt×INT.

The degradation estimating device 101 adds the divided degradation value qd[jt] to the peeling degradation value Qdst (Step S212).

The degradation estimating device 101 sets the divided degradation value qd[jt] to zero (Step S214).

The degradation estimating device 101 updates the value of the SOC_old to the sum of the SOC_old and the interval INT (Step S216).

Meanwhile, when the sc[N] is equal to or less than the sum of the SOC_old and the interval INT (NO in Step S208), the degradation estimating device 101 compares the sc[N] with a value obtained by subtracting the interval INT from the SOC_old (Step S218).

When the sc[N] is equal to or less than the value obtained by subtracting the interval INT from the SOC_old (YES in Step S218), the degradation estimating device 101 updates the value of the SOC_old to the value obtained by subtracting the interval INT from the SOC_old (Step S220).

Next, the degradation estimating device 101 updates the SOC_old (Step S216 and Step S220), or when the sc[N] is larger than the value obtained by subtracting the interval INT from the SOC_old (NO in Step S218), updates the values of the respective elements qd[1] to qd[Dnum] in the array Aqd by using Equation (6) (Step S222).

The degradation estimating device 101 compares the index N and the number of elements Snum of the array Ats with each other, and increments the index N (Step S226) when the index N and the number of elements Snum are different from each other (NO in Step S224).

Next, the degradation estimating device 101 compares the sc[N] and the sum of the SOC_old and the interval INT with each other (Step S208).

Meanwhile, when the index N and the number of elements Snum coincide with each other (YES in Step S224), the degradation estimating device 101 performs calculation processing for the energization degradation value Qcur (Step S228). Specifically, the degradation estimating device 101 calculates, as the energization degradation value Qcur, a sum of the peeling degradation value Qdst and the film degradation value Qrgn that is a sum of the qd[1] to qd[Dnum].

As mentioned above, in this flowchart, the sampling interval in which the fluctuation range of the SOC at the sampling interval becomes smaller than the interval INT is assumed. However, when the fluctuation range is equal to or more than the interval INT, a plurality of the corresponding indices are determined in Step S210 described above, thus making it possible to calculate the energization degradation value Qcur.

Effects

FIG. 13 to FIG. 20 are diagrams illustrating examples of errors in the estimation for the battery degradation by the degradation estimating device. In each of FIG. 13 to FIG. 20, an axis of ordinate represents errors, and an axis of abscissa represents the number of cycles.

Herein, for example, each of the errors is a value that represents, by a percentage, a value obtained by dividing an absolute value of a difference between a calculated value and a measured value by the measured value.

In each of FIG. 13 to FIG. 20, there are illustrated an error change Cvi by the degradation estimating device according to the embodiment of the present invention and an error change Cvr by a comparative example. A calculated value by the comparative example is calculated, for example, based on an integrated value of absolute values of currents which have flown in and out of the battery, the absolute values being amounts of conducted electricity.

In FIG. 13 to FIG. 16, there are illustrated results when the center SOC is changed while the fluctuation range of the SOC is fixed to 20%.

Figure 13:
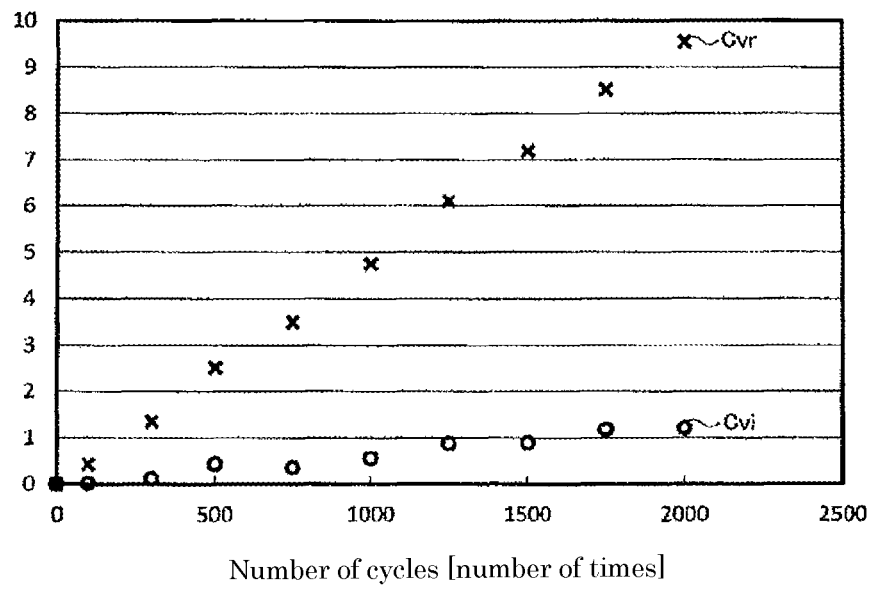
FIG. 13 is a diagram illustrating an example of errors in the estimation for the battery degradation by the degradation estimating device.

More specifically, in FIG. 13, error changes Cvi and Cvr after the charge-discharge is repeated so that the fluctuation of the SOC remains within a range of 0% to 20% are plotted with respect to the number of cycles.

Figure 14:
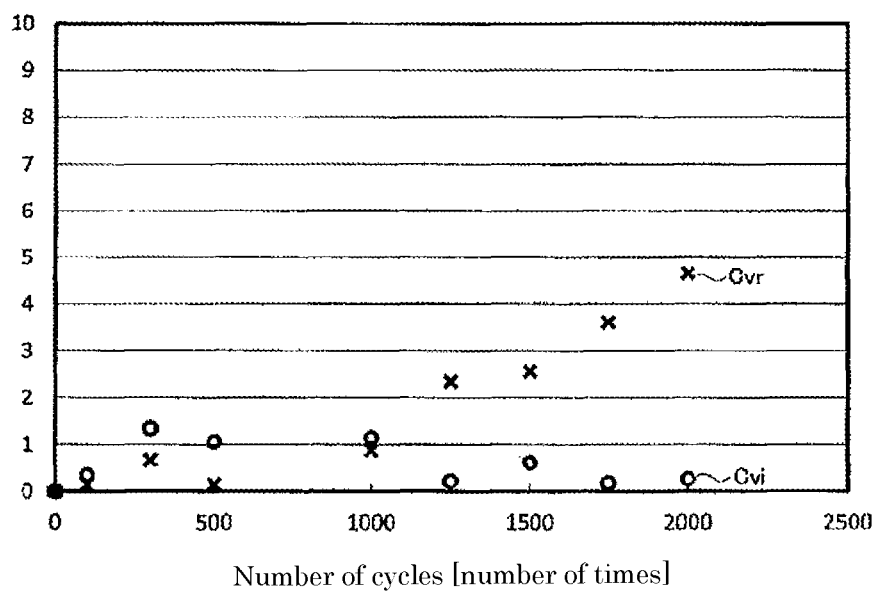
FIG. 14 is a diagram illustrating an example of the errors in the estimation for the battery degradation by the degradation estimating device.

In FIG. 14, error changes Cvi and Cvr after the charge-discharge is repeated so that the fluctuation of the SOC remains within a range of 20% to 40% are plotted with respect to the number of cycles.

Figure 15:
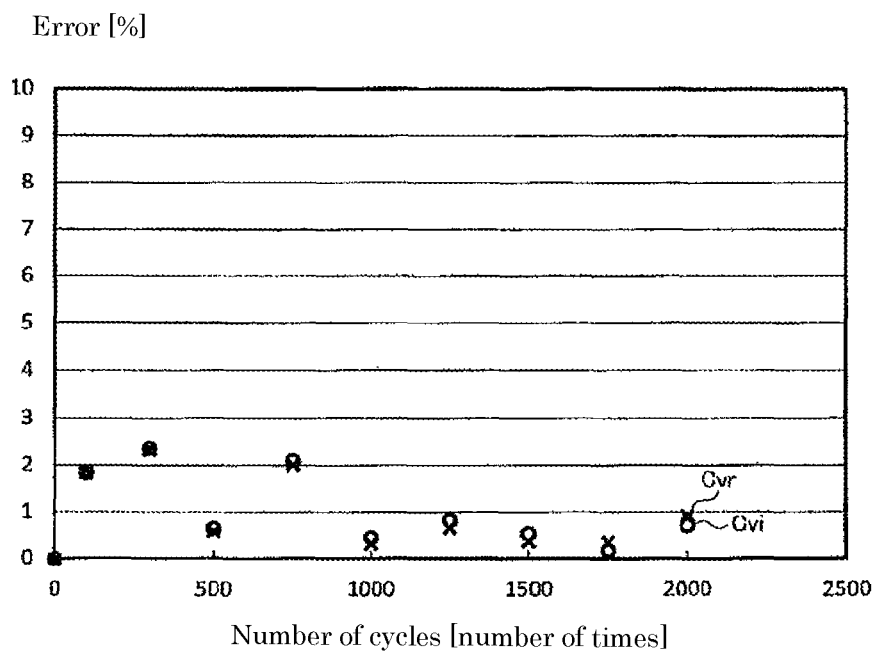
FIG. 15 is a diagram illustrating an example of the errors in the estimation for the battery degradation by the degradation estimating device.

In FIG. 15, error changes Cvi and Cvr after the charge-discharge is repeated so that the fluctuation of the SOC remains within a range of 40% to 60% are plotted with respect to the number of cycles.

Figure 16:
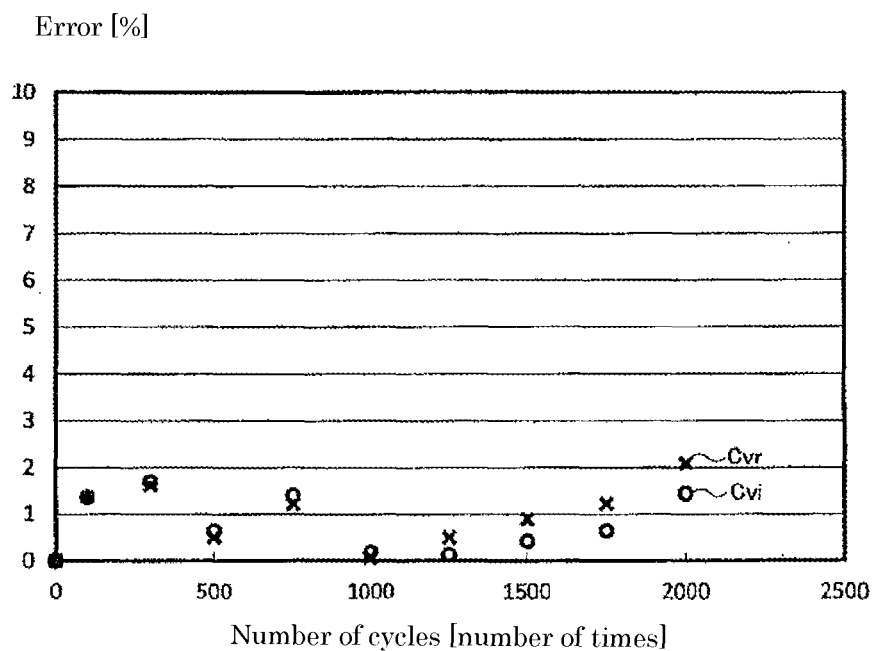
FIG. 16 is a diagram illustrating an example of the errors in the estimation for the battery degradation by the degradation estimating device.

In FIG. 16, error changes Cvi and Cvr after the charge-discharge is repeated so that the fluctuation of the SOC remains within a range of 60% to 80% are plotted with respect to the number of cycles.

As illustrated in FIG. 13 to FIG. 16, in the comparative example, the error is suppressed when the fluctuation of the SOC remains within the range of 40% to 60% and the range of 60% to 80%; however, the error increases in response to an increase of the number of cycles when the fluctuation of the SOC remains within the range of 0% to 20% and the range of 20% to 40%

Meanwhile, in the degradation estimating device according to the embodiment of the present invention, the error is suppressed in any of the fluctuation magnitudes of the SOC in spite of the increase of the number of cycles.

FIG. 17 to FIG. 20 illustrate results when the fluctuation range of the SOC is changed while the center SOC is fixed to 60%.

Figure 17:
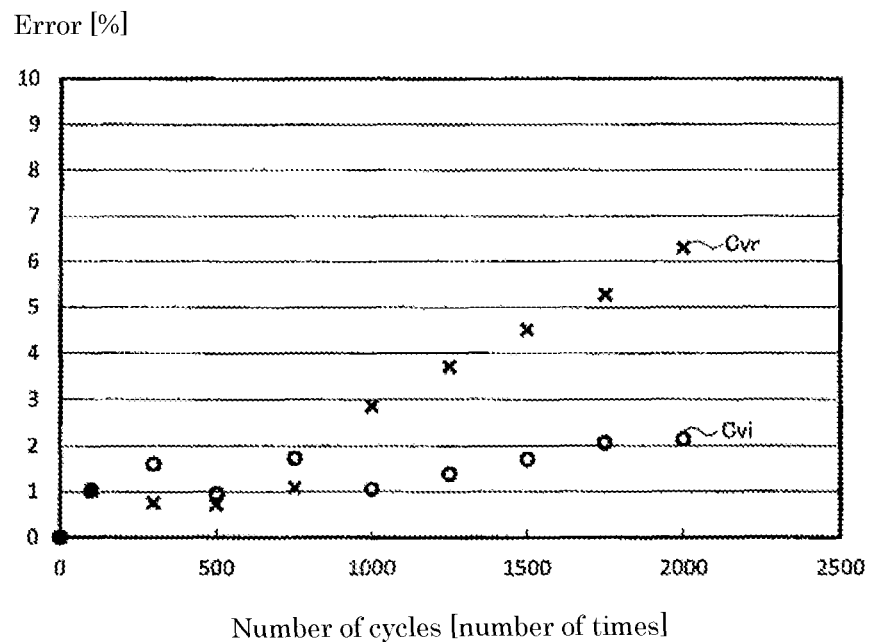
FIG. 17 is a diagram illustrating an example of the errors in the estimation for the battery degradation by the degradation estimating device.

More specifically, in FIG. 17, error changes Cvi and Cvr after the charge-discharge is repeated so that the center SOC is 60% and the fluctuation range of the SOC becomes 1% are plotted with respect to the number of cycles.

Figure 18:
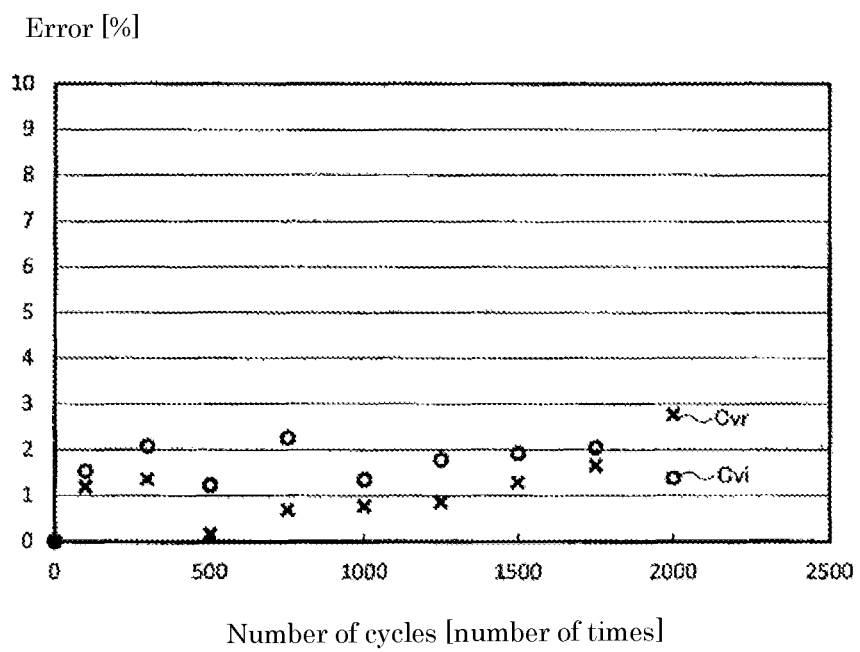
FIG. 18 is a diagram illustrating an example of the errors in the estimation for the battery degradation by the degradation estimating device.

In FIG. 18, error changes Cvi and Cvr after the charge-discharge is repeated so that the center SOC is 60% and the fluctuation range of the SOC becomes 10% are plotted with respect to the number of cycles.

Figure 19:
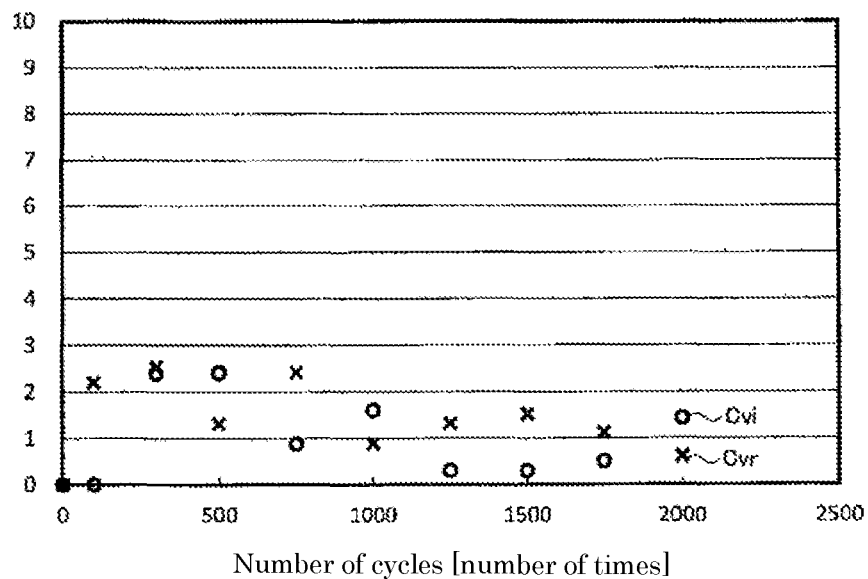
FIG. 19 is a diagram illustrating an example of the errors in the estimation for the battery degradation by the degradation estimating device.

In FIG. 19, error changes Cvi and Cvr after the charge-discharge is repeated so that the center SOC is 60% and the fluctuation range of the SOC becomes 40% are plotted with respect to the number of cycles.

Figure 20:
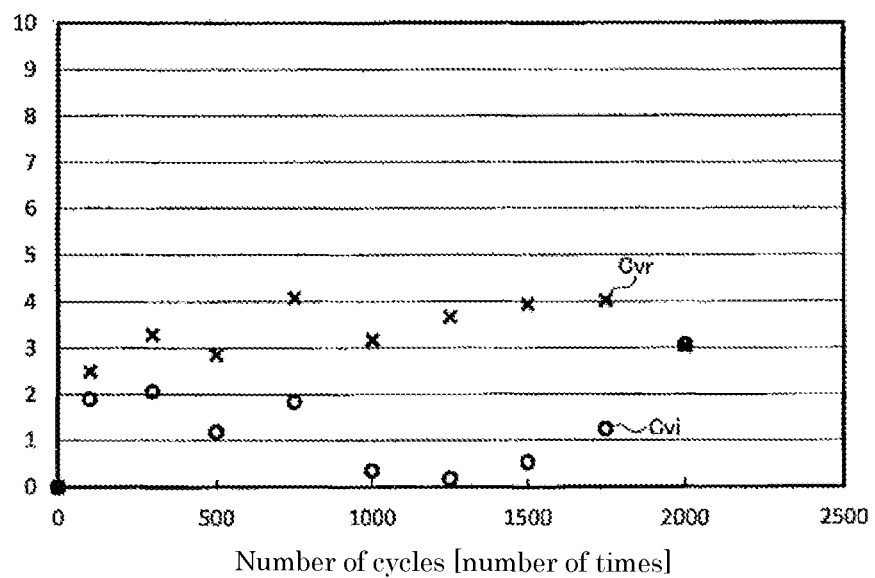
FIG. 20 is a diagram illustrating an example of the errors in the estimation for the battery degradation by the degradation estimating device.
Figure 21:
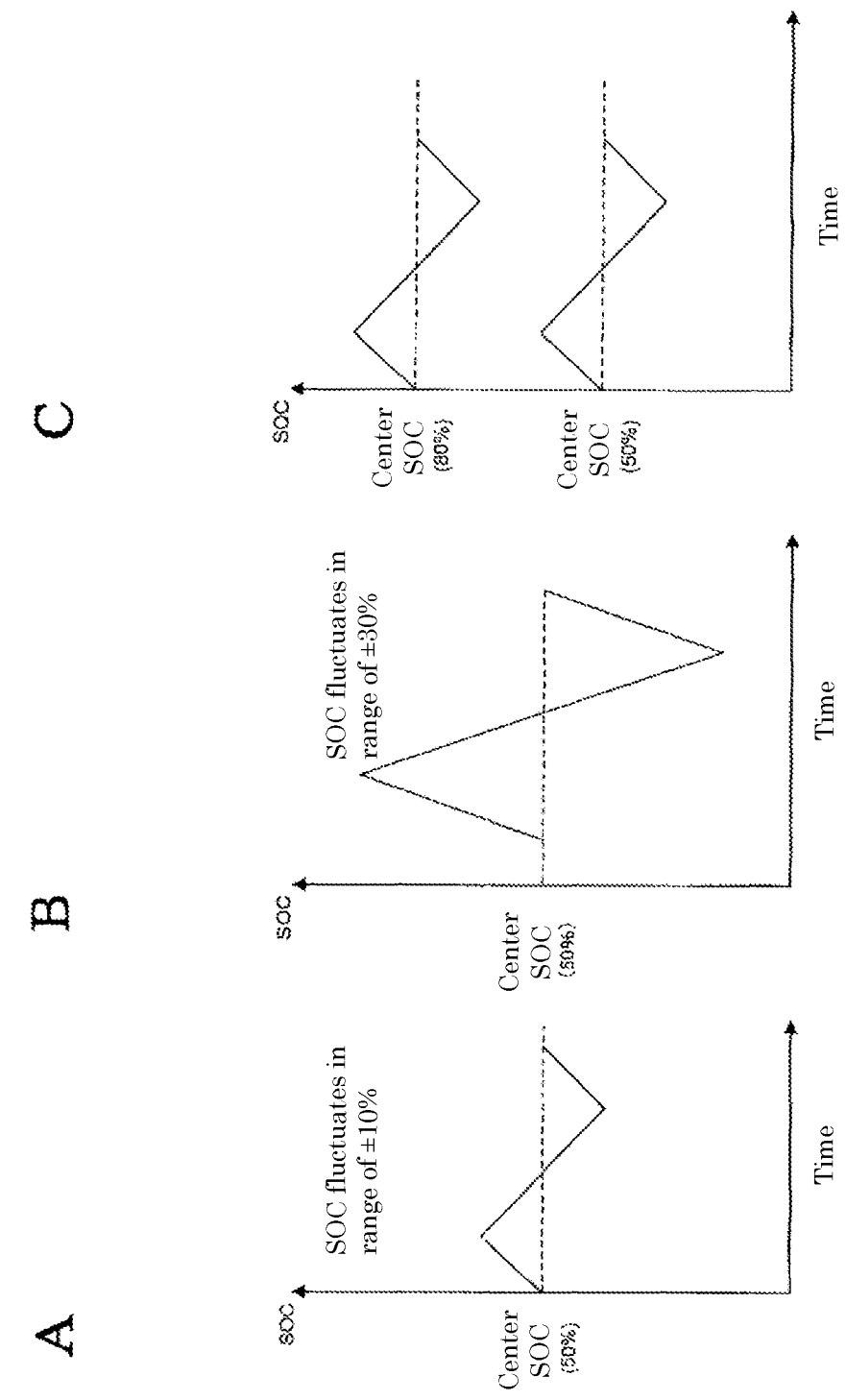
FIG. 21 is diagrams illustrating a variety of fluctuation modes of an SOC.

In FIG. 20, error changes Cvi and Cvr after the charge-discharge is repeated so that the center SOC is 60% and the fluctuation range of the SOC becomes 60% are plotted with respect to the number of cycles.

As illustrated in FIG. 17 to FIG. 20, in the comparative example, the error is suppressed when the fluctuation range of the SOC is 10% and 40%; however, the error is large when the fluctuation range of the SOC is 1% and 60%.

Meanwhile, in the degradation estimating device 101 according to the embodiment of the present invention, the error is equivalent or suppressed in any of the fluctuation ranges of the SOC.

Second Embodiment

A degradation estimating device 101 according to a second embodiment has a similar configuration to that of the degradation estimating device 101 according to the first embodiment except for being different therefrom in the following points.

A history creation unit 54 of the degradation estimating device 101 of the second embodiment stores a count value of a counter 55 at a sampling time and digital signals Di, Dv and Dt in a storage unit 56. In the storage unit 56, the sampling time, a current value, a voltage value and a temperature T are accumulated every sampling time, and in addition, the number of charge-discharge cycles is stored. Every time when the charge-discharge is repeated, the number of charge-discharge cycles is updated.

Figure 22:
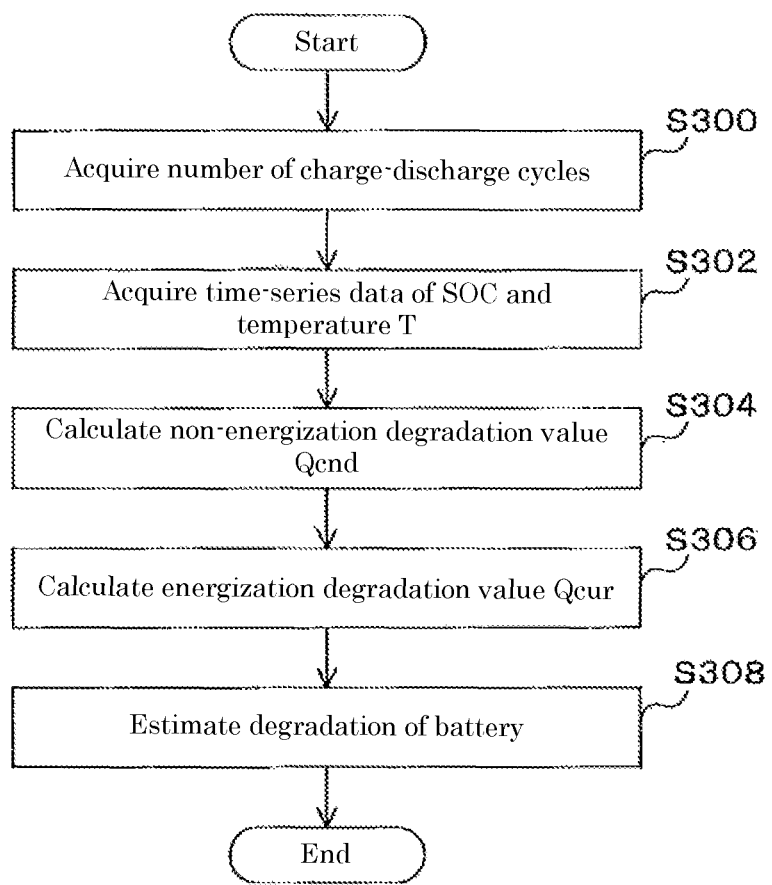
FIG. 22 is a flowchart illustrating an operation procedure when a degradation estimating device according to a second embodiment performs estimation for battery degradation.

Referring to FIG. 22, a situation where a control unit 20 of the degradation estimating device 101 receives an estimation command from another device is assumed. A case will be described below where the charge-discharge is repeated, for example, so that the SOC goes back and forth within a range from 40% to 80%.

First, the degradation estimating device 101 acquires the number of charge-discharge cycles (Step S300).

The degradation estimating device 101 acquires time-series data of the SOC and the temperature T in the battery (Step S302).

Next, the degradation estimating device 101 calculates a non-energization degradation value Qcnd of the battery based on the time-series data of the SOC and the temperature T (Step S304).

The degradation estimating device 101 calculates an energization degradation value Qcur of the battery based on the time-series data of the SOC and the temperature T (Step S306).

The degradation estimating device 101 calculates a sum of the energization degradation value Qcur and the non-energization degradation value Qcnd as a degradation value Qdeg indicating degradation of the battery, and estimates the degradation (a shift of a capacity balance) of the battery based on a result of the calculation (Step S308). The energization degradation value Qcur and the non-energization degradation value Qcnd are calculated so that a difference between the energization degradation value Qcur and the non-energization degradation value Qcnd increases following the increase of the number of charge-discharge cycles. For example, a cycle test is performed in advance, and at least one of the coefficient kc and the coefficient kr is changed in response to the number of charge-discharge cycles.

An order of the above-described Steps S300 and S302 and order of the above-described Steps S304 and S306 are not limited to the above-described ones, and the orders may be changed.

FIG. 13 to FIG. 20 also illustrate examples of errors in the estimation for the battery degradation by the degradation estimating device 101 of the second embodiment. That is, FIG. 13 illustrates an error change when the charge-discharge is repeated so that the SOC goes back and forth within a range of 0% to 20% with respect to the number of cycles. FIG. 14 illustrates an error change when the charge-discharge is repeated so that the SOC goes back and forth within a range of 20% to 40% with respect to the number of cycles. FIG. 15 illustrates an error change when the charge-discharge is repeated so that the SOC goes back and forth within a range of 40% to 60% with respect to the number of cycles. FIG. 16 illustrates an error change when the charge-discharge is repeated so that the SOC goes back and forth within a range of 60% to 80% with respect to the number of cycles.

FIG. 17 illustrates an error change when the charge-discharge is repeated so that the SOC goes back and forth within a range of 59.5% to 60.5% with respect to the number of cycles. FIG. 18 illustrates an error change when the charge-discharge is repeated so that the SOC goes back and forth within a range of 55% to 65% with respect to the number of cycles. FIG. 19 illustrates an error change when the charge-discharge is repeated so that the SOC goes back and forth within a range of 40% to 80% with respect to the number of cycles. FIG. 20 illustrates an error change when the charge-discharge is repeated so that the SOC goes back and forth within a range of 30% to 90% with respect to the number of cycles.

From FIG. 13 to FIG. 20, it is confirmed that the degradation of the energy storage device can be estimated more accurately than heretofore by adopting new finding that the shift of the capacity balance increases as the number of charge-discharge cycles increases.

An amount of decrease (an amount of the capacity degradation) of the amount of electricity reversibly extractable from the energy storage device, the decrease being caused by the increase of the shift of the capacity balance, is estimated, thus making it possible to grasp an internal state of the energy storage device. A potential of the negative electrodes in 100% of the SOC is also seen, and accordingly, when the energy storage device is a lithium ion secondary battery, a risk of precipitation of metal lithium in the negative electrodes is also seen. A state of health (SOH) of the energy storage device, which also includes the risk, can be monitored. An SOC-OCV curve can be obtained based on the shift of the capacity balance, and accordingly, how the energy storage device is to be controlled can also be determined.

Each of the degradation estimating devices 101 according to the first embodiment and second embodiment of the present invention is configured to be provided inside the monitoring device 151; however, is not limited to this. The degradation estimating device 101 may be provided outside the monitoring device 151. In this case, the degradation estimating device 101 acquires the time-series data of the SOC from the monitoring device 151, for example, via a bus such as a universal serial bus (USB) cable.

The degradation estimating device 101 is configured to use the time-series data of the SOC; however, is not limited to this. In place of the time-series data of the SOC, the degradation estimating device 101 may use time-series data of absolute values such as amounts of charge, time-series data of charge levels, and the like. The time-series data of the SOC may be ASOC obtained by a current integration method or the like, or may be data obtained by adding/subtracting the ASOC to/from an initial value of the SOC.

In the degradation estimating device 101, the estimating unit 22 is configured to calculate the degradation value as the estimation for the battery degradation; however, is not limited to this. The estimating unit 22 may calculate a level indicating the degradation of the battery, a lifetime of the battery, a replacement time of the battery, and the like.

In the degradation estimating device 101, the estimating unit 22 is configured to calculate the energization degradation value Qcur based on the fluctuation magnitude of the SOC, the SOC at each point of time of the acquisition, and the temperature T at each point of time of the acquisition; however, is not limited to this. The estimating unit 22 may estimate the degradation of the battery based on the fluctuation magnitude of the SOC. For example, when the fluctuation magnitude of the SOC is small and the fluctuation magnitude of the temperature T is small, the estimating unit 22 may set the coefficient kr to a fixed value.

The estimating unit 22 may be configured to estimate the degradation of the battery due to the energization, for example, based on the fluctuation magnitude of the SOC. The estimating unit 22 calculates the energization degradation value Qcur, for example, by using the coefficient kr as a fixed value.

The estimating unit 22 may be configured to estimate the degradation of the battery, for example, based on the fluctuation magnitude of the SOC and the fluctuation center of the SOC in the time-series data. Alternatively, the estimating unit 22 may be configured to estimate the degradation of the battery, for example, based on the fluctuation magnitude of the SOC and the SOC at each point of time of the acquisition. For example, when the fluctuation of the temperature T is small, the estimating unit 22 is capable of calculating the energization degradation value Qcur and the non-energization degradation value Qcnd by using the coefficient kr and the coefficient kc as functions of the SOC.

In the degradation estimating device 101, the estimating unit 22 is configured to estimate the degradation of the energy storage device based on the sum of the energization degradation value Qcur and the non-energization degradation value Qcnd; however, is not limited to this. The estimating unit 22 may be configured to estimate the degradation of the energy storage device based on the energization degradation value Qcur without using the non-energization degradation value Qcnd. For example, when the elapsed time from a state where the battery is new is short, the estimating unit 22 is capable of estimating the degradation of the energy storage device accurately based on the energization degradation value Qcur.

In the degradation estimating device 101, the estimating unit 22 is configured to calculate the energization degradation value Qcur based on the peeling degradation value Qdst; however, is not limited to this. The estimating unit 22 may calculate the energization degradation value Qcur without using the peeling degradation value Qdst.

The above-described embodiments are not limitative. The scope of the present invention is intended to incorporate all changes within the scope of claims and within the meaning and scope of equilibria of claims.

DESCRIPTION OF REFERENCE SIGNS 20 control unit
21 acquiring unit 22 estimating unit
23 storage unit
231 degradation estimating program
51 current sensor
52 voltage sensor
53 temperature sensor
54 history creation unit
55 counter
56 storage unit
57 communication unit
60 recording medium
101 degradation estimating device
151 monitoring device

The invention claimed is:

1. A degradation estimating device, comprising:
an acquiring unit that acquires time-series data of a state of charge (SOC) in an energy storage device; and
an estimating unit that estimates degradation of the energy storage device based on a fluctuation magnitude of the SOC in the time-series data acquired by the acquiring unit,
wherein the estimating unit calculates an estimated degradation value which indicates the degradation, based on a sum of an energization degradation value, calculated based on the fluctuation magnitude of the SOC, and a non-energization degradation value indicating degradation of the energy storage device not being due to the energization, the estimated degradation value increasing in response to the fluctuation magnitude of the SOC.

2. The degradation estimating device according to claim 1, wherein the estimating unit estimates the degradation of the energy storage device based on the fluctuation magnitude of the SOC and a fluctuation center of the SOC in the time-series data.

3. The degradation estimating device according to claim 1, wherein the estimating unit estimates the degradation of the energy storage device based on a state change of a solid electrolyte interface (SEI) surface film on a negative electrode of the energy storage device, the state change being based on the fluctuation magnitude of the SOC.

4. The degradation estimating device according to claim 3, wherein the estimating unit estimates the degradation of the energy storage device based on a mathematical model in which breakage and regeneration of the SEI surface film on the negative electrode of the energy storage device are considered.

5. The degradation estimating device according to claim 4, wherein the mathematical model further considers degradation of the energy storage device due to an SEI surface film peeled off from the negative electrode of the energy storage device.

6. The degradation estimating device according to claim 1, wherein the time-series data comprises data of the SOC stored at intervals of sampling time.

7. The degradation estimating device according to claim 1, wherein the time-series data stores data for the SOC at every predetermined sampling time interval.

8. The degradation estimating device according to claim 1, wherein the energization degradation value indicates degradation of the energy storage device due to energization.

9. The degradation estimating device according to claim 1, wherein the estimating unit estimates the degradation of the energy storage device based on the fluctuation magnitude of the SOC of a solid electrolyte interface (SEI) surface film on an electrode of the energy storage device.

10. A degradation estimating device comprising an estimating unit that estimates degradation of a capacity of an energy storage device in a predetermined number of charge-discharge cycles by a sum of an energization degradation value indicating degradation of the energy storage device due to energization and a non-energization degradation value indicating degradation of the energy storage device not being due to the energization, the capacity being an amount of electricity reversibly extractable from the energy storage device,
wherein a difference between the energization degradation value and the non-energization degradation value increases following an increase of the number of charge-discharge cycles.

11. The degradation estimating device according to claim 10, further comprising an acquiring unit that acquires time-series data of a state of charge (SOC) in the energy storage device,
wherein the estimating unit estimates the energization degradation value based on the time-series data of the SOC.

12. A degradation estimating device comprising an estimating unit that estimates degradation of a capacity of an energy storage device in a predetermined number of charge-discharge cycles by a sum of an energization degradation value indicating degradation of the energy storage device due to energization and a non-energization degradation value indicating degradation of the energy storage device not being due to the energization, the capacity being an amount of electricity reversibly extractable from the energy storage device,
wherein the estimating unit estimates the energization degradation value by a sum of a film degradation value resulting from a solid electrolyte interface (SEI) surface film that grows on a negative electrode of the energy storage device and a peeling degradation value resulting from an SEI surface film peeled off from the negative electrode.

13. A degradation estimating method of an energy storage device, the method comprising:
acquiring time-series data of a state of charge (SOC) in the energy storage device;
estimating degradation of the energy storage device based on a fluctuation magnitude of the SOC in the acquired time-series data; and
calculating an estimated degradation value which indicates the degradation, based on a sum of an energization degradation value, calculated based on the fluctuation magnitude of the SOC, and a non-energization degradation value indicating degradation of the energy storage device not being due to the energization, the estimated degradation value increasing in response to the fluctuation magnitude of the SOC.

14. A degradation estimating method of an energy storage device, the method comprising:
estimating degradation of a capacity of an energy storage device in a predetermined number of charge-discharge cycles by a sum of an energization degradation value indicating degradation of the energy storage device due to energization and a non-energization degradation value indicating degradation of the energy storage device not being due to the energization, the capacity being an amount of electricity reversibly extractable from the energy storage device, wherein a difference between the energization degradation value and the non-energization degradation value increases following an increase of the number of charge-discharge cycles.

15. A non-transitory computer-readable medium comprising instructions that, when executed by a computer, cause the computer:
- to acquire time-series data of a state of charge (SOC) in an energy storage device;
- to estimate degradation of the energy storage device based on a fluctuation magnitude of the SOC in the acquired time-series data; and
- to calculate an estimated degradation value which indicates the degradation, based on a sum of an energization degradation value, calculated based on the fluctuation magnitude of the SOC, and a non-energization degradation value indicating degradation of the energy storage device not being due to the energization, the estimated degradation value increasing in response to the fluctuation magnitude of the SOC.

16. A non-transitory computer-readable medium comprising instructions that, when executed by a computer, cause the computer:
- to execute processing of estimating degradation of a capacity of an energy storage device in a predetermined number of charge-discharge cycles by a sum of an energization degradation value indicating degradation of the energy storage device due to energization and a non-energization degradation value indicating degradation of the energy storage device not being due to the energization, the capacity being an amount of electricity reversibly extractable from the energy storage device,
- wherein a difference between the energization degradation value and the non-energization degradation value increases following an increase of the number of charge-discharge cycles.

* * * * *